United States Patent [19]

Kamiyama et al.

[11] Patent Number: 5,796,408
[45] Date of Patent: Aug. 18, 1998

[54] CHARGED PARTICLE BEAM DRAWING DATA PRODUCTION APPARATUS AND CHARGED PARTICLE BEAM DRAWING SYSTEM

[75] Inventors: Kinya Kamiyama; Koichi Moriizumi; Makoto Kanno; Hironobu Taoka, all of Hyogo, Japan

[73] Assignee: Mitsubishi Denki Kabushiki Kaisha, Tokyo, Japan

[21] Appl. No.: 555,074

[22] Filed: Nov. 8, 1995

[30] Foreign Application Priority Data

Jun. 2, 1995 [JP] Japan ................. 7-136583

[51] Int. Cl.$^6$ .................................. G06F 15/00
[52] U.S. Cl. .................................. 345/441
[58] Field of Search .................. 395/119, 120, 395/140, 141; 345/419, 420, 440, 441, 120, 118, 434

[56] References Cited

U.S. PATENT DOCUMENTS

| | | | |
|---|---|---|---|
| 4,878,177 | 10/1989 | Ikenaga et al. | 364/489 |
| 5,008,830 | 4/1991 | Moriizumi et al. | 364/490 |
| 5,636,337 | 6/1997 | Boenke et al. | 395/135 |

FOREIGN PATENT DOCUMENTS 0 367 496  5/1990  European Pat. Off. .

5-166706  7/1993  Japan .

*Primary Examiner*—Phu K. Nguyen
*Attorney, Agent, or Firm*—Oblon, Spivak, McClelland, Maier & Neustadt, P.C.

[57] ABSTRACT

A system for preventing deterioration of dimensional accuracy by reducing production of micro graphics at the time of production of drawing data to be input to a charged particle beam drawing apparatus. A CPU divides a design layout data into units of graphic data processing area (a step S1) and executes elimination of duplication and tone reversal processes in both X direction and Y direction (steps S2A, S2B) for the respective graphic data processing areas. Moreover, it performs, with reference to a micro graphic dimensional value, the graphic data processing result judging and selecting function in both the X direction and Y direction (a step S3) for the respective graphic data processing areas. Namely, the CPU judges as the micro graphic when the dimension of a basic graphic after the elimination of duplication and tone reversal processes is no larger than the micro graphic dimensional value, compares the two by determining the sum of such micro graphics, for example, in the X, Y directions and selects the graphic data submitted to the elimination of duplication and tone reversal process for the direction with smaller value. The CUP further performs prescribed processing (steps S4, S5) of this graphic data to complete the production of drawing data.

12 Claims, 22 Drawing Sheets

$h1 < h2 < d$

FIG. 25
| | MICRO GRAPHIC DIMENSIONAL VALUE REGION | | WEIGHING |
|---|---|---|---|
| (1) | $0.4 < L \leq 0.5$ | → | 1 |
| (2) | $0.3 < L \leq 0.4$ | → | 2 |
| (3) | $0.2 < L \leq 0.3$ | → | 3 |
| (4) | $0.1 < L \leq 0.2$ | → | 4 |
| (5) | $L \leq 0.1$ | → | 5 |
FIG. 26
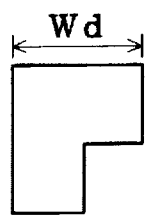
FIG. 27
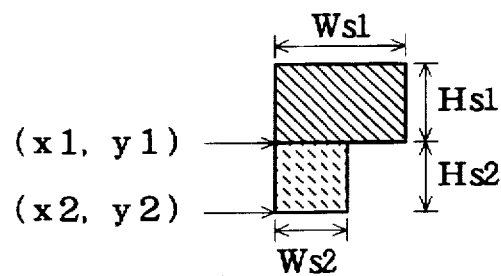

CHARGED PARTICLE BEAM DRAWING DATA PRODUCTION APPARATUS AND CHARGED PARTICLE BEAM DRAWING SYSTEM

BACKGROUND OF THE INVENTION

1. Field of the Invention

The present invention relates to a charged particle beam drawing data production apparatus and a charged particle beam drawing system, which sharply reduce generation of micro graphics causing deterioration of dimensional accuracy.

2. Description of the Background Art

Electron beam drawing is widely used, for its high fine processing performances and controllability, for the production of masks used for the manufacture of semiconductor devices, particularly large-scale integrated circuits (LSI circuits).

The drawing system of electron beam drawing can be classified into 2 types, that is, raster scan type and vector scan type. The raster scan type has been widely used for the production of masks for the simplicity of equipment construction and the ease of production of drawing data. A problem about the raster scan type is that the drawing speed largely depends on the size of the drawn graphic and the minimum grid size (corresponding to address unit size) for specifying the drawing position. When this raster scan type is applied actually to the production of masks in the case requiring fine address units (corresponding to the minimum unit capable of expressing a drawn graphic) like a 64-Mbit dynamic random access memory (DRAM), etc., there are cases where drawing is impossible with the raster scan type because of an excessively long drawing time.

So, attention is being given in recent years to variable shaping type which is a system of the vector scan types. This variable shaping type drawing system consists in shaping an electron beam according to the size of the drawn graphic and irradiating the electron beam only on the necessary area. For that reason, this drawing system makes it possible to achieve a large drawing speed and yet set the address unit size for a smaller size. Therefore, the variable shaping type is believed to come to constitute the mainstream for the direct drawing of electron beam used for the production of masks of devices after the 64M DRAM and development of devices after a 1 G DRAM.

While the variable shaping type has such advantages as described above, it also has a problem, in the production of drawing data, that it requires a longer processing time because of complexity of the processing compared with the raster scan type.

Description will be given hereafter on the drawing data production procedure and the drawing procedure used for the variable shaping type drawing system.

FIG. 26 indicates part of design pattern data (corresponding to design layout data) of an LSI circuit, which is usually expressed with a polygon (that is, arrangement of coordinate data at each vertex). As described above, to write this design pattern data with the variable shaping type electron beam drawing system, it is first necessary to divide the design pattern into basic graphics such as rectangles, squares, triangles, trapezoids, etc. (hereinafter generally referred to as "basic graphic" or "trapezoid"). FIG. 27 and FIG. 28 indicate examples in which the polygon of FIG. 26 is divided into 2 basic graphics by inserting a dividing line from the respective vertexes of the polygon of FIG. 26 in the horizontal and the vertical directions respectively.

Next, description will be given on the procedure of actually drawing graphics by using drawing data processed after division into basic graphics as described above.

First, when the pattern data in the shaded part indicated in the drawing data of FIG. 27 split in the horizontal direction is input in the electron beam drawing system, the electron beam drawing system forms an electron beam having a size of a width WS1 and a height HS1, by means of a defecting device for shaping electron beam.

Next, the electron beam is moved to the irradiation position (x1, y1) indicated in FIG. 27 by a deflecting device for specifying electron beam irradiation position located inside the electron beam drawing system, and the electron beam is irradiated on a resist coated on a sample such as a mask board, a silicon wafer, etc. for a time corresponding to the amount of exposure necessary for the sensitizing of the resist. Next, the graphic data of the shaded part of the drawing data indicated in FIG. 27 are input in the electron beam drawing system, and the electron beam drawing is executed in the same way. By repeating this operation one after another for all patterns in the LSI circuit, the drawing of all patterns in the LSI circuit is performed.

The variable shaping type drawing system described above has the following 2 problems in the production of drawing data:

(1) One is a problem occurred when the design layout data is divided into basic graphics drawable by the variable shaping type electron beam drawing system. Such division procedure is hereinafter referred to as "trapezoidal division". This problem will be described in detail hereafter.

The design layout data indicated in FIG. 26 is converted into the electron beam drawing data (hereinafter simply referred to as "drawing data") and drawing is made on the mask by using this drawing data. A resist pattern is formed on the mask by making resist development to that drawing. FIG. 29 indicates the resist pattern. Now, attention will be paid to the dimensional accuracy of the pattern at the portion determined with the width Wm of this resist pattern to consider factors causing deterioration of accuracy. However, factors relating to pattern forming process conditions such as resist development, etc. will be put out of consideration here.

In the case where the design layout data indicated in FIG. 26 is divided with a dividing line in the horizontal direction as in FIG. 27, the factor having influence on the dimension of the width Wm of FIG. 29 is only the shaping accuracy of the electron beam formed according to the graphic in the shaded part of FIG. 27 i.e. the dimensional accuracy of the electron beam of the portion corresponding to width WS1.

On the other hand, when the design layout data is divided with a dividing line in the vertical direction as indicated in FIG. 28, the factors having influence on the dimension of the width Wm of FIG. 29 are the accuracy of the irradiation position (x1, y1) of the electron beam corresponding to the shaded part indicated in FIG. 28, the accuracy of the irradiation position (x2, y2) of electron beam corresponding to the broken line part and its shaping accuracy (that is, width WS2). In this case, the shaping accuracy (that is, width WS1) of the electron beam corresponding to the shaded part does not constitute the factor. Consequently, in the case of FIG. 28, the number of the factors having influence on the dimensional accuracy of the resist pattern increases by 2 compared with the case where the pattern is divided with a dividing line in the horizontal direction as in FIG. 27.

FIG. 30 and FIG. 31 indicate the results of measurement of dimensions of the resist patterns on the mask obtained by forming a plural number of resist patterns by using drawing data of different dividing methods as shown in FIG. 27 and FIG. 28, respectively. Of those drawings, FIG. 30 indicates deviations of resist pattern in the case of use of drawing data indicated in FIG. 27, namely a case where the resist pattern of the portion of width Wm indicated in FIG. 29 is formed with irradiation of 1 shot of the electron beam. On the other hand, FIG. 31 indicates the result in the case of use of drawing data indicated in FIG. 28, namely a case where the resist pattern of the portion of width Wm indicated in FIG. 29 is formed with irradiation of 2 shots of the electron beam at different irradiation positions ((x1, y1), (x2, y2)). In the both drawings, a symbol Wd indicates the center value.

As it is understood from FIG. 30, FIG. 31, while, in the case where the resist pattern is formed by the irradiation of 1 shot of the electron beam, the deviation of the resist pattern dimension is of +0.025 µm or so, this deviation of the resist pattern dimension increases to approximately ±0.075 µm when the resist pattern is formed by the irradiation of 2 shots of the electron beams. Therefore, it is understood that the deviation of resist pattern dimension i.e. the deterioration of dimensional accuracy becomes more conspicuous in the case where the resist pattern is formed by the irradiation of 2 shots of the electron beams compared with the case of the irradiation of 1 shot of the electron beam. In other words, it means that the accuracy of resist pattern dimension is much affected by the way of dividing of the design layout data at the time of production of the drawing data. This is one of the problems occurred in the production of variable shaping type drawing data.

(2) The second problem is that, in the case where the resist pattern is formed by irradiation of no less than 2 shots of the electron beams at different irradiation positions, the dimensional accuracy of the resist pattern formed further deteriorates in the case where the shot forming the edges of the resist pattern is of extremely small size. This point will be described by using FIG. 32 to FIG. 35.

FIG. 32 shows an example of position data of drawn graphic in the case where drawing is made with 1 shot of the electron beam. The graph given in FIG. 33 indicates the distribution of intensity of the electron beam formed in the shape as shown in FIG. 32. As shown in FIG. 33, the distribution of intensity of the electron beam is not perfectly rectangular but trails the skirt at the edges x1, x2. The slope of the distribution of intensity at the edges (hereinafter referred to as "beam sharpness") changes with the size of the formed beam. Generally, the larger the size of the formed beam, the larger the Coulomb's repulsion inside the electron beam and, as a result, the beam sharpness diminishes and the distribution of intensity at the edges becomes blurred.

FIG. 35 indicates the distribution of intensity of the electron beam in the case were a pattern of the same size as the drawn graphic indicated in FIG. 32 is irradiated with 2 shots of the electron beams and that the portion formed with 1 shot of the electron beam on the left side is of extremely small size (see FIG. 34). In the case indicated in FIG. 35, the distribution of intensity at the edge portion (corresponding to a portion of position x1 on the left side) is different from that in the case of drawing with 1 shot (see FIG. 33), and this produces a difference in the dimension of resist pattern formed. In this case, in addition to such problem, there is also another problem that it is not easy to form electron beam of micro size from the viewpoint of electric current control and, as a result, the shape of the electron beam becomes unstable, further accelerating the deterioration of dimensional accuracy of the resist pattern.

FIG. 36 indicates the result of measurement of the dimensions of respective resist patterns obtained by producing a plural number of resist patterns with 2 shots including the micro graphic as shown in FIG. 34 as pattern frequency (corresponding to the number of patterns of same dimension included). In this case, in addition to an increase of the dimensional deviation, a difference is produced also in the average value compared with the result in the case of drawing with 1 shot (FIG. 30). The difference of average value originates from the electron beam irradiation of the micro graphic described above.

The size of micro graphic presenting the conspicuous deterioration of dimensional accuracy of the resist pattern as described above i.e. dimensional value of micro graphic largely depends on the type of electron beam drawing system use, kind of resist, processing method or conditions of pattern formation, etc. but is generally no more than 0.5 µm. Therefore, when setting the dimensional value of micro graphic at 0.5 µm, the micro graphic means a graphic the length of the side in either the direction of width or the direction of height is no more than 0.5 µm.

Next, taking account of the above-described 2 problems (1), (2), a study will be made on tile method of production in the drawing data producing apparatus of the conventional variable shaping type electron beam drawing apparatus, so as to actualize technical problems innate in the conventional drawing data producing apparatus.

FIG. 37 indicates the data processing flow in the conventional drawing data producing apparatus.

① First of all, the design layout data eliminates duplication of graphics with the duplication eliminating function of the drawing data producing apparatus (step T1). This is made for the purpose of preventing duplication in the irradiation of electron beam on one same area (OR processing) and is a processing essential for the production of drawing data by a variable shaping type electron beam drawing system.

In this case, various methods are conceivable as method for elimination of duplication but the method generally used is a method of dividing the graphic into stripes (hereinafter referred to as "stripe method") as shown in FIG. 38 and FIG. 39. Here, description will be given on a case where this stripe method is applied to step T1 of FIG. 37.

First, dividing lines are inserted on the entire processing area in a fixed direction (corresponding to a horizontal direction or vertical direction) from the vertex of respective graphics to form the stripes. Next, the respective graphics are divided at stripe borders. FIG. 38 and FIG. 39 indicate a case of division in the horizontal direction.

Next, orientation is given (vectoring) to each side of the respective split graphics. The way of orientation is decided by either right turn or left turn of the respective vertexes along the sides. FIG. 38 and FIG. 39 represent a case of right turn (clockwise).

Next unnecessary vectors (that is, duplicated portion of graphic) are deleted The method of deletion is described hereafter.

First, each vector is sorted with coordinate values for each stripe. Next, a numerical value is given to each vector in correspondence to the direction of vector. For example, upward vectors are given as 1 and downward vectors as −1. This example is indicated in relation to stripe 5 of FIG. 38.

Next, in the case where stripes are formed horizontally, the numerical values given to respective vectors (corresponding to vectorial values) are added in order from the left in search of a vector where the total becomes 0. And, a graphic is constructed with the vector in which the addition was started and the vector where the result of addition of vectorial values becomes 0.

An example of such processing may be described as follows about the stripe 5 in FIG. 39: Namely, addition is started from the vector at the left end, and the result of addition of vectorial values becomes 2 in the stage of addition of the second vector, the result of addition of vectorial values becomes 1 in the stage of addition of the third vector, and the result of addition of vectorial values becomes 0 in the stage of addition of the fourth vector. Therefore, a graphic is constructed with the vector at the left end in stripe 5 and the fourth vector counting from there, and the second and the third vectors are deleted as unnecessary vectors. The result of processing becomes as indicated in FIG. 39.

By performing such processing to the vectors in all stripes, duplication of all graphics can be deleted.

It can be seen that, when this method is used, the data as results of processing are all divided into basic graphics. However, as it is apparent from the results of division in FIG. 39, no countermeasure is taken into account at all about the problems described earlier i.e. the problems of (1) division of portion requiring high dimensional accuracy, and (2) generation of graphics of extremely small size. Therefore, the step T1 in FIG. 37 results in producing deterioration of dimension accuracy due to the 2 problems (1), (2) described above.

②The next process branches off into 2 flows (T2), (T2A T2B) as shown in FIG. 37 depending the type of resist used (positive, negative) and the way of layout taken in the design.

Namely, in the case where the electron beam must be irradiated on the portion other than the area of input made at the time of design, a process for tone reversal of graphic (step T2) becomes necessary. This tone reversal process can also be performed by a method similar to that of elimination of duplication among graphics described earlier. So, the method of tone reversal of graphic is described hereafter by using FIG. 40 and FIG. 41.

The processing is started from the state in which the respective sides after elimination of duplication of graphics are divided in vectors. First, an area (frame) for tone reversal is set, and the graphic (that is, a rectangle) corresponding to this frame is split into vectors according to the respective stripes and a vector direction value is set for each vector in the same way as in the case of elimination of duplication.

Next, the direction of vector included in the tone reversal area is reversed. In its relation with FIG. 38 and FIG. 39, the vectors set upward are made to look downward and the vectors set downward are made to look upward at the time of elimination of duplication. This state is indicated in FIG. 40.

The processing after that is the same as the processing for elimination of duplication. The addition of vectorial values is started from the vector on the frame of tone reversal for each stripe to search for a pair of vectors where the added value becomes 0, thus forming a graphic. FIG. 41 indicated the tone reversed state.

Also when the tone reversal is made, it is seen that no consideration is given to any countermeasure against (1) division of portion requiring high dimensional accuracy, and (2) generation of graphics of extremely small size, in the same way as in the case of elimination of duplication.

On the other hand, when no tone reversal is required, it is possible to implement the countermeasure. Namely, as a method which takes account of division of portion requiring high dimensional accuracy and generation of graphics of extremely small size, it is possible to take the method of turning the graphic split into basic graphics as a result of elimination of duplication into polygons again (step T2A), and dividing those polygons again one by one while taking account of the division of portion requiring high dimensional accuracy and generation of graphics of extremely small size (step T2B).

However, this processing method (T2A, T2B) cannot be applied to the case requiring the tone reversal process. That is because, if any group of graphics submitted to tone reversal is turned into polygons again, all graphics are connected to one another and turn into a single polygon having an enormous number of vertexes, making any subsequent processing i.e. redividing into basic graphics practically impossible.

For that reason, in the conventional method, no countermeasure was taken against the above-described problem of deterioration of dimensional accuracy due to (1) division of graphics, and (2) generation of extremely small graphics in the case where the tone reversal is necessary.

By referring again to FIG. 37, when basic graphic data is generated and stored (step T3), then the drawing field border dividing function in step T4 is executed. This function is a function of dividing the drawing area into areas where the electron beam drawing system can draw with deflection of electron beam only (hereinafter referred to as "drawing field areas"). After that, the electron beam drawing data formatting function for formatting the data into a structure available for inputting in various drawing systems of step T5 is executed, to thereby generate the electron beam drawing data. The variable shaping type electron beam drawing system taken up here as example can set the size of the drawing field area at an optional value of usually 2.5 mms or under.

SUMMARY OF THE INVENTION

The invention of claim 1 is a charged particle beam drawing data production apparatus for producing a drawing data signal to be input in a charged particle beam drawing apparatus from a design layout data signal, comprising input means for inputting a signal giving a graphic data processing area dimensional data, and graphic data processing area dividing means for dividing an area given by the design layout data signal into units of a graphic data processing area, the graphic data processing area being determined by the graphic data processing area dimensional data which is given by the input means.

The invention of claim 2 is a charged particle beam drawing data production apparatus defined in claim 1, wherein the input means further inputs a signal giving a micro graphic dimensional value, and the charged particle beam drawing data production apparatus further comprises graphic data processing result generating means for executing, for each of the graphic data processing areas and for both a horizontal direction and a vertical direction of the area given by the design layout data signal, a prescribed graphic processing operation to the design layout data signal to generate a graphic data processing result, the graphic data processing result giving data signals of basic graphics formed in the graphic data processing area concerned, and graphic data processing result judging & selecting means for judging, for each of the graphic data processing areas and for each of the horizontal direction and the vertical direction, data signals which give micro graphics from among the data signals of the basic graphics included in the graphic data processing result on the basis of the signal of the micro graphic dimensional value to determine a micro graphic evaluation value indicating a degree of influence of the micro graphics on charged particle beam drawing, and for comparing the micro graphics evaluation values regarding both the horizontal direction and the vertical direction to thereby select the graphic data processing result regarding the direction of which the micro graphic evaluation value is smaller.

The invention of claim 3 is a charged particle beam drawing data production system defined in claim 2, wherein the graphic data processing result generating means comprises duplication eliminating & tone reversing means for executing a removal process of duplicated parts and a tone reversal process in the design layout data signal as the prescribed graphic processing operation.

The invention of claim 4 is a charged particle beam drawing data production system defined in claim 3, wherein the graphic data processing result judging & selecting means comprises micro graphic judging means for judging that the data signal of the basic graphic concerned provides the micro graphic when at least one of dimensional values of sides of the basic graphic is no larger than the micro graphic dimensional value, for each of the horizontal direction and the vertical direction.

The invention of claim 5 is a charged particle beam drawing data production system defined in claim 4, wherein the graphic data processing result judging & selecting means further comprises micro graphic evaluation value computing means for accumulating the number of the micro graphics according to a judgement result of the micro graphic judging means to output its sum as the micro graphic evaluation value, for each of the horizontal direction and the vertical direction.

The invention of claim 6 is a charged particle beam drawing data production system defined in claim 4, wherein the graphic data processing result judging & selecting means further comprises micro graphic evaluation value computing means for accumulating the lengths of long side of the micro graphics according to the judgement result of the micro graphic judging means to output its sum as the micro graphic evaluation value, for each of the horizontal direction and the vertical direction.

The invention of claim 7 is a charged particle beam drawing data production system defined in claim 4, wherein the graphic data processing result judging & selecting means further comprises micro graphic evaluation value computing means for computing and accumulating the surface areas of the micro graphics according to the judgement result of the micro graphic judging means to output a sum of the surface areas of the micro graphics as the micro graphic evaluation value, for each of the horizontal direction and the vertical direction.

The invention of claim 8 is a charged particle beam drawing data production system defined in claim 4, wherein the graphic data processing result judging & selecting means further comprises micro graphic evaluation value computing means for computing and accumulating the aspect ratios given as a ratio of length of long side to length of short side of the micro graphics according to the judgement result of the micro graphic judging means to output a sum of the aspect ratios of the micro graphics as the micro graphic evaluation value, for each of the horizontal direction and the vertical direction.

The invention of claim 9 is a charged particle beam drawing data production system defined in claim 3, wherein the input means not only specifies the signal giving the micro graphic dimensional value over a plural number of micro graphic dimensional value regions but also provides a signal giving a weighing, the weighing defining a degree of importance of dimension of the micro graphic, for each of the plural number of micro graphic dimensional regions, and the graphic data processing result judging & selecting means comprises micro graphic judging means for judging whether or not at least one of dimensional values of sides of the basic graphic falls in any of the plural number of micro graphic dimensional regions, to thereby judge whether or not the data signal of the basic graphic provides the micro graphic, for each of the horizontal direction and the vertical direction, and micro graphic evaluation value computing means for computing the micro graphic evaluation value on the basis of the signal giving the weighing provided in corresponding the micro graphic dimensional value regions in response to a result judged as the micro graphic by the micro graphic judging means, for each of the horizontal direction and the vertical direction.

The invention is claim 10 is a charged particle beam drawing data production system defined in claim 2, wherein the graphic data processing result generating means comprises duplication eliminating means for executing removal of duplicated parts in the design layout data signal as the prescribed graphic processing operation.

The invention of claim 11 is a charged particle beam drawing data production apparatus for producing a drawing data signal to be input in a charged particle beam drawing apparatus from a design layout data signal, comprises input means for inputting a signal giving a micro graphics dimensional value, graphic data processing result generating means for executing prescribed graphic processing operations to the design layout data signal to generate a graphic data processing result giving data signals of basic graphics formed in an area given by the design layout data signal, for each of a horizontal direction and a vertical direction of the area, and graphic data processing result judging & selecting means for judging data signals which give micro graphics from among the data signals of the basic graphics included in the graphic data processing result on the basis of the signal of the micro graphic dimensional value to determine a micro graphic evaluation value indicating a degree of influence of the micro graphics on charged particle beam drawing, for each of the horizontal direction and the vertical direction, and for comparing the micro graphic evaluation values regarding the horizontal direction and the vertical direction to select the graphic data processing result regarding the direction of which the micrographic evaluation value is smaller.

The invention of claim 12 is a charged particle beam drawing system, comprising a charged particle beam drawing data production apparatus for producing a drawing data signal from a design layout data signal given, and a charged particle beam drawing apparatus for performing charged particle beam drawing on the basis of the drawing data signal to form a resist pattern, the charged particle beam drawing data production apparatus comprising input means for inputting a signal giving a graphic data processing area dimension and a signal giving a micro graphic dimensional value, graphic data processing area dividing means for dividing an area given by the design layout data signal into units of a graphic data processing area determined by the graphic data processing area dimension, graphic data processing result generating means for executing prescribed graphic processing operations to the design layout data signal for both a horizontal direction and a vertical direction of the area given by the design layout data signal, to generate a graphic data processing result giving data signals of basic graphics formed in the graphic data processing area concerned, for each graphic data processing area, graphic data processing result judging & selecting means for judging data signals which give micro graphics from among the data signals of the basic graphics included in the graphic data processing result on the basis of the signal of the micro graphic dimensional value given by the input means to thereby determine a micro graphic evaluation value indicating a degree of influence of the micro graphics on charged particle beam drawing, for each of the horizontal direction and the vertical direction, and for comparing the micro graphic evaluation values regarding the horizontal direction and the vertical direction to select and output the graphic data processing result regarding the direction of which the micro graphic evaluation value is smaller, for each graphic data processing area, and drawing data producing means for producing the drawing data signal on the basis of the drawing data processing result output by the graphic data processing result judging & selecting means.

In the invention of claim 1, the drawing data signal is produced from the design layout data signal in the respective graphic data processing areas generated as a result of a division made by the graphic data processing area dividing means.

According to the invention of claim 1, it is possible to produce drawing data capable of suppressing deterioration of dimensional accuracy of patterns formed by the charged particle beam drawing apparatus.

In the invention of claim 2, the following processings are executed for the respective graphic data processing areas: Namely, the graphic data processing result generating means generates the graphic data processing result regarding the horizontal direction by performing the graphic operations relating to the horizontal direction and also generates the graphic data processing result regarding the vertical direction by performing the graphic operations relating to the vertical direction. Moreover, the graphic data processing result judging & selecting means judges inclusion or not of the micro graphic in the graphic data processing result regarding the horizontal direction to determine its micro graphic evaluation value and also judges inclusion or not of the micro graphic in the graphic data processing result regarding the vertical direction to determine its micro graphic evaluation value, and then compares the micro graphic evaluation value regarding the horizontal direction and the micro graphic evaluation value regarding the vertical direction to judge the relative size of the two. At that time, when the micro graphic evaluation value regarding the vertical direction is smaller, the graphic data processing result judging & selecting means selects the graphic data processing result regarding the vertical direction. The drawing date produced from this selected graphic data processing result becomes a high-quality data with little influence of micro graphics.

According to the invention of claim 2, it is possible to reduce generation of the micro graphics produced at the time of the prescribed graphic operations and produce drawing data of high quality capable of suppressing deterioration of dimensional accuracy.

In the invention of claim 3, the graphic data processing result judging & selecting means selects the graphic data processing result with less generation of the micro graphics produced at the time of elimination of duplication and tone reversal.

According to the invention of claim 3, it is possible to suppress, by division in units of the graphic data processing area, the areas in which, conventionally, the respective vertexes have influences on the division of other graphic data at the time of conventional elimination of duplication and tone reversal and to sharply reduce generation of the micro graphics produced at the time of the elimination of duplication and tone reversal, to eventually produce drawing data of high quality.

In the invention of claim 4, the graphic data processing result judging & selecting means judges a micro graphic or not with reference, as criteria, to the relation of {(at least one of dimensional values of sides of basic graphic)≦(micro graphic dimensional value)}.

According to the invention of claim 4, it is possible to judge presence or not of the micro graphic against the graphic data processing result.

In the invention of claim 5, the graphic data processing result judging & selecting means evaluates the degree of influence of micro graphics with the sum of the number of micro graphics.

According to the invention of claim 5, it is possible to perform the micro graphic evaluation of high accuracy to thereby produce high-quality results of graphic data processing capable of suppressing deterioration of dimensional accuracy and, therefore, drawing data of high quality.

In the invention of claim 6, the graphic data processing result judging & selecting means evaluates the degree of influence of micro graphics with the sum of the lengths of long sides of micro graphics.

According to the invention of claim 6, it is possible to perform the micro graphic evaluation of higher accuracy to thereby produce high-quality results of graphic data processing capable of sharply suppressing deterioration of dimensional accuracy and, therefore, drawing data of higher quality.

In the invention of claim 7, the graphic data processing result judging & selecting means evaluates the degree of influence of micro graphics with the surface areas of micro graphics.

According to the invention of claim 7, it is possible to perform the micro graphic evaluation of higher accuracy to thereby produce higher-quality results of graphic data processing capable of sharply suppressing deterioration of dimensional accuracy and, therefore, drawing data of higher quality.

In the invention of claim 8, the graphic data processing result judging & selecting means evaluates the degree of influence of micro graphics with the sum of aspect ratios of micro graphics According to the invention of claim 8, it is possible to perform the micro graphic evaluation of still higher accuracy to thereby produce still higher-quality results of graphic data processing capable of sharply suppressing deterioration of dimensional accuracy and, therefore, drawing data of still higher quality.

In the invention of claim 9, more carefully thought computation of the micro graphic evaluation value is executed by the weighing provided for the respective micro graphic dimensional regions.

According to the invention of claim 9, it is possible to perform the micro graphic evaluation of still higher accuracy to thereby produce still higher-quality results of graphic data processing capable of sharply suppressing deterioration of dimensional accuracy and, therefore, drawing data of still higher quality.

In the invention of claim 10, the graphic data processing result with less generation of micro graphics produced at the time of elimination of duplication is selected by the graphic data processing result judging & selecting means.

According to the invention of claim 10, it is possible to reduce generation of the micro graphics produced at the time of the elimination of duplication even in the case wherein a tone reversal process is not necessary, and eventually to produce drawing data of high quality, while suppressing deterioration of dimensional accuracy.

In the invention of claim 11, the graphic data processing result judging & selecting means selects the graphic data processing result with less generation of micro graphics.

According to the invention of claim 11, it is possible to reduce generation of the micro graphics produced at the time of a predetermined graphic computation process, and eventually to produce drawing data of high quality, while suppressing deterioration of dimensional accuracy.

In the invention of claim 12, the graphic operations regarding the horizontal direction and the vertical direction are performed by the graphic data processing result generating means for the respective graphic data processing areas, and the kind of graphic data processing result to be used is selected by the graphic data processing result judging & selecting means with reference to the graphic data evaluation value.

According to the invention of claim 12, it is possible to obtain a desirable graphic data processing result wherein the generation of the micro graphics is remarkably suppressed. Therefore, it is possible to produce drawing data of high quality, and eventually to improve dimensional accuracy of the resist pattern.

And, for the respective graphic data processing areas, drawing data is prepared from the selected graphic data processing result of high quality, and charged particle beam drawing is performed based on this drawing data.

The present invention intends to provide a charged particle beam drawing data production system which is capable of sharply reducing production of micro graphics which is a factor causing deterioration of dimensional accuracy, with special at according the fact that dimensional accuracy remarkably deteriorates according to the prior art, especially when tone reversal is required.

Moreover, the present invention can be directed only for solving various problems produced as a result of elimination of duplication, and the present invention further intends to provide more desirable new technologies.

These and other objects, features, aspects and advantages of the present invention will become more apparent from the following detailed description of the present invention when taken in conjunction with the accompanying drawings.

BRIEF DESCRIPTION OF THE DRAWINGS

FIG. 25 is a drawing showing the relation between region of micro graphic dimensional value and its weighing;

FIG. 26 is a drawing showing the design layout data for describing production procedure of drawing data by the conventional variable shaping type apparatus;

FIG. 27 is a drawing showing the electron beam drawing data for describing the conventional variable shaping type drawing procedure;

13

Figure 29:
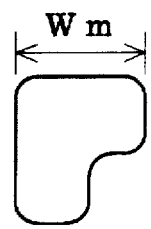
Figure 30:
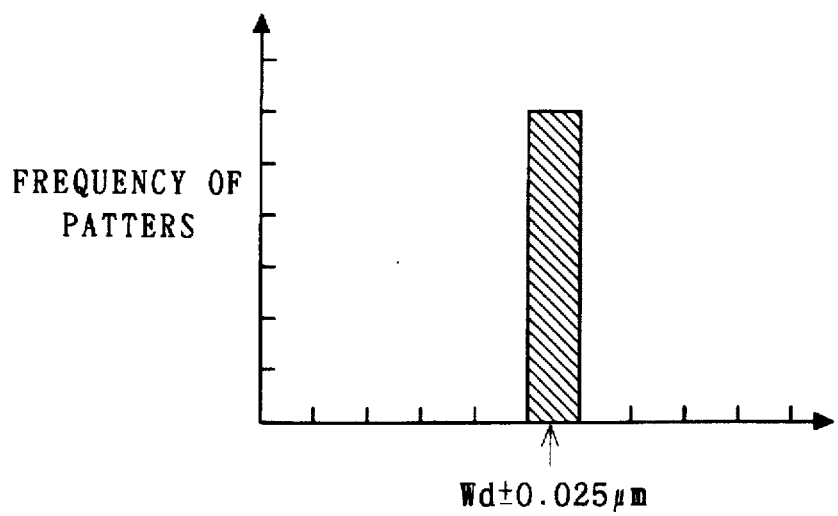
Figure 31:
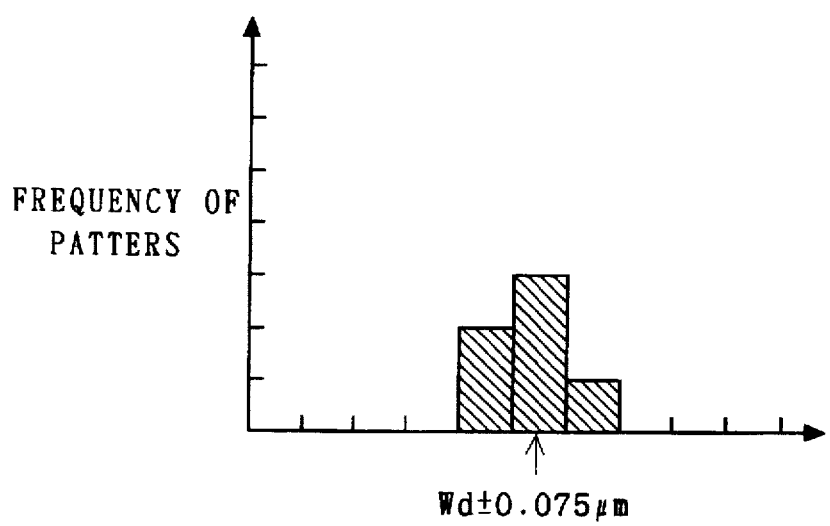
Figure 32:
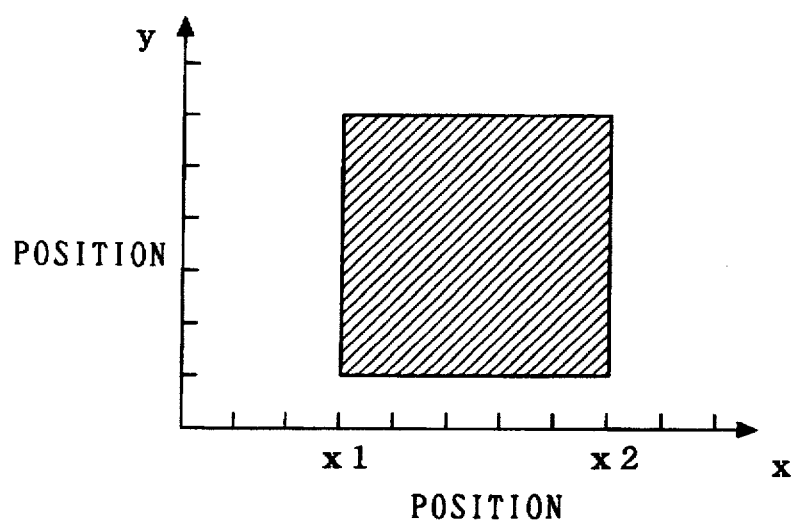
Figure 33:
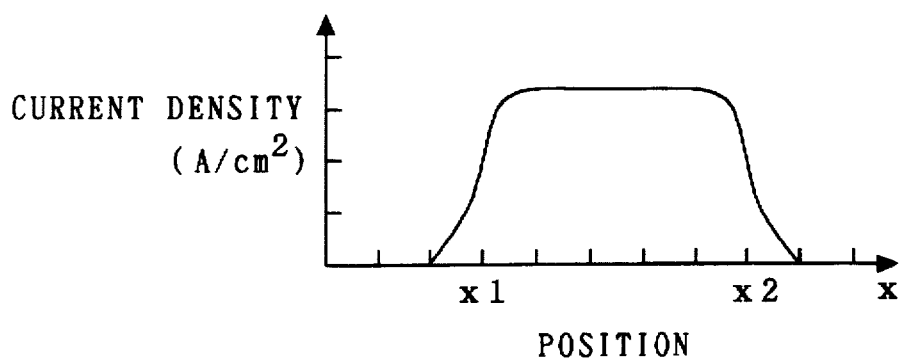
Figure 34:
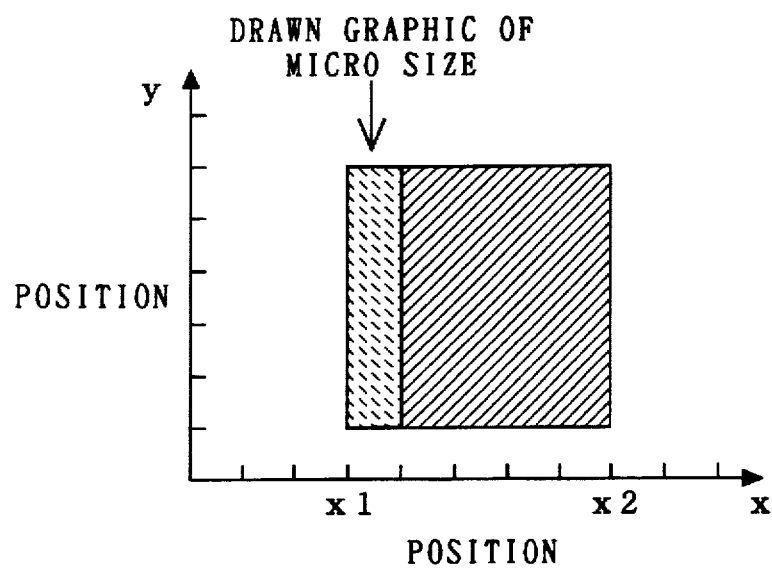
Figure 35:
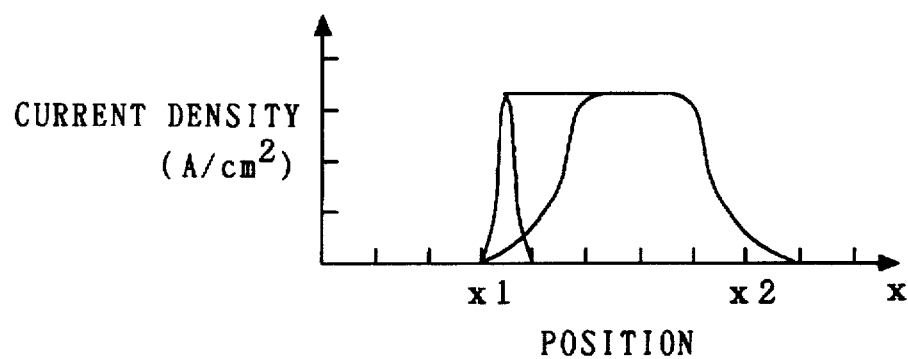
Figure 36:
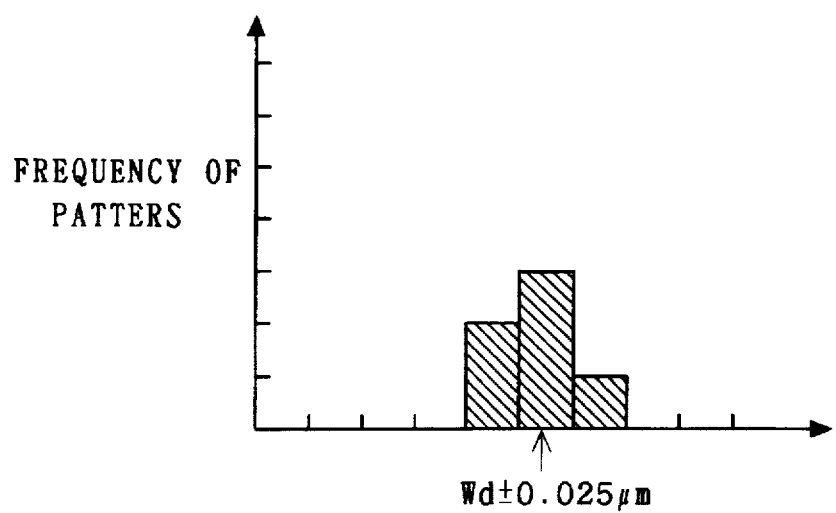
Figure 37:
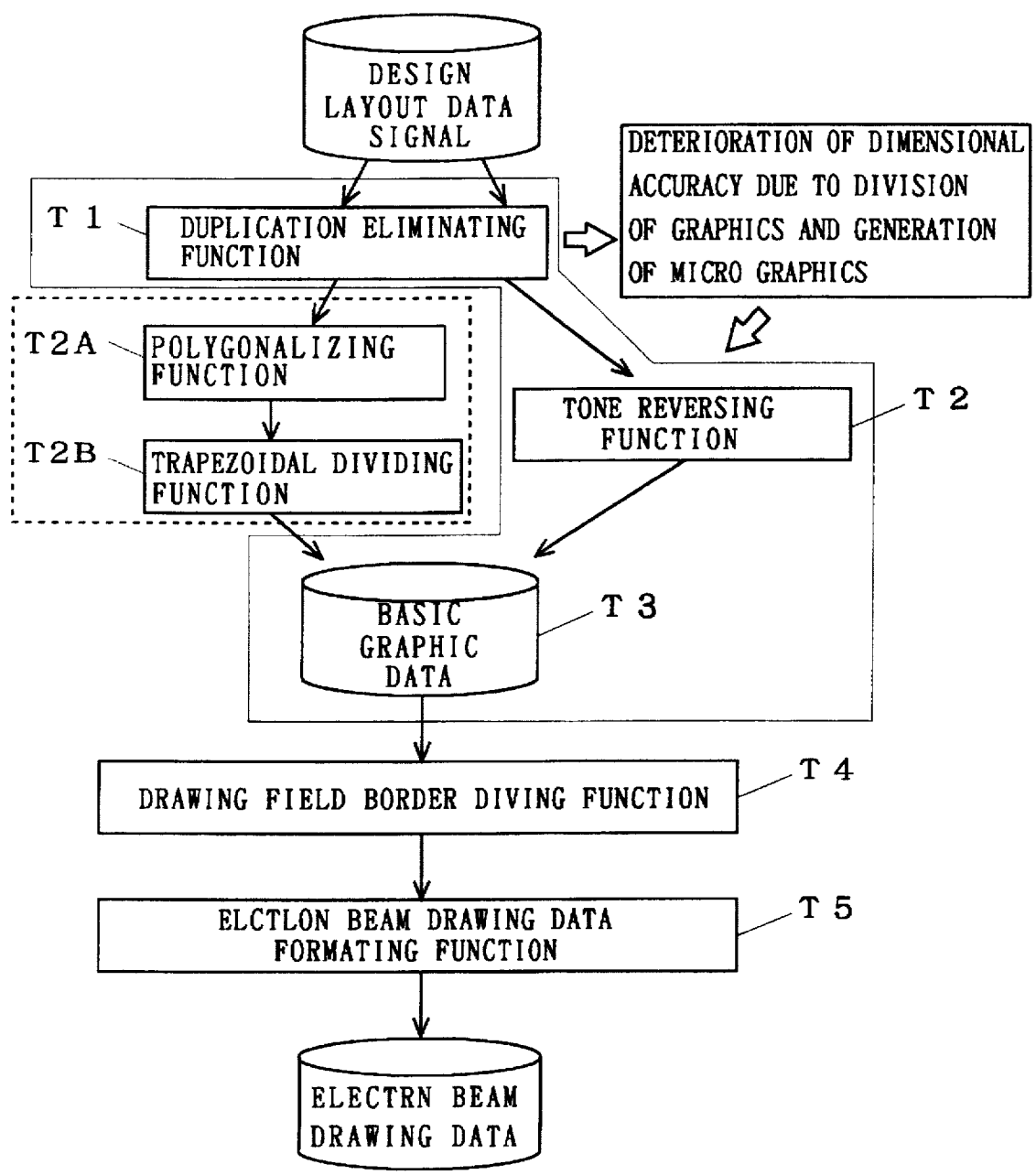
Figure 38:
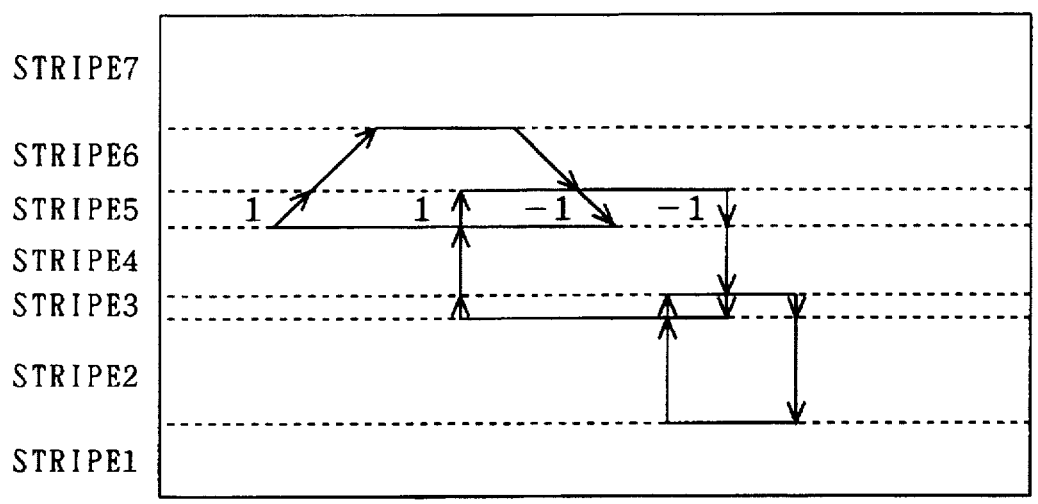
Figure 39:
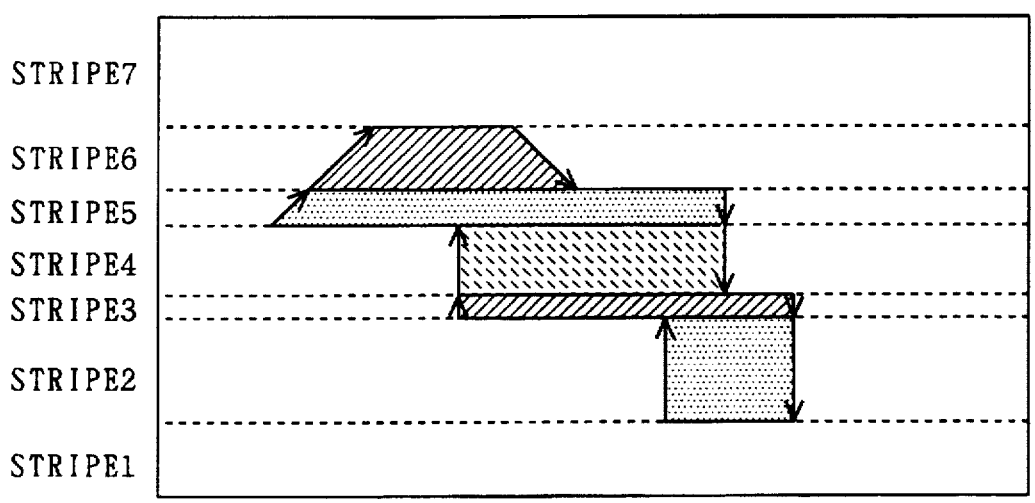
Figure 40:
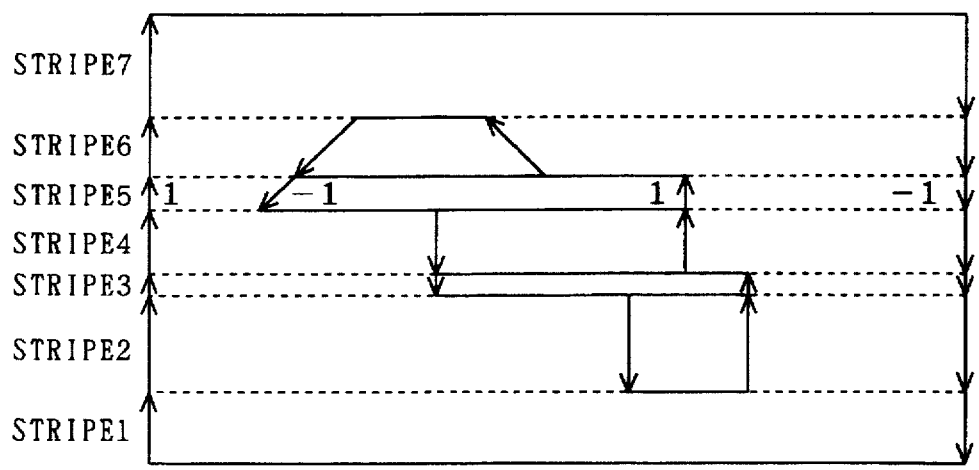
Figure 41:
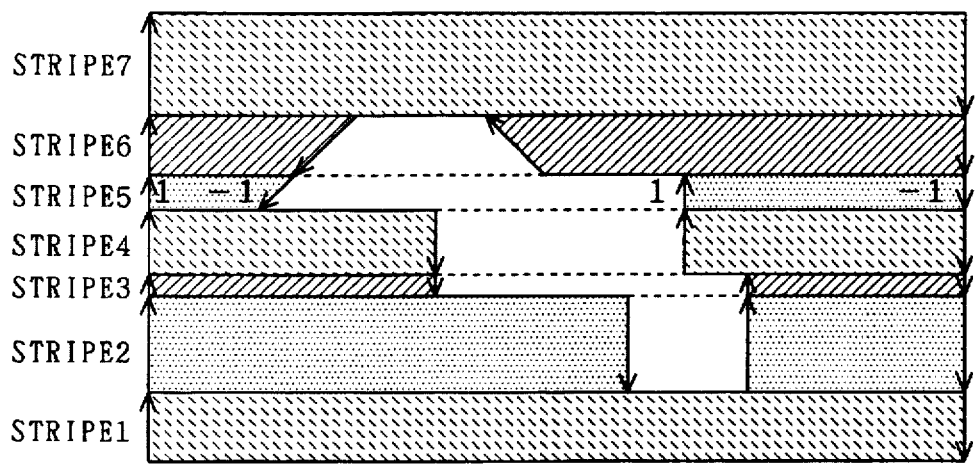

FIG. 29 is a drawing showing the resist pattern on a mask for describing problems in the production of drawing data by the conventional variable shaping type apparatus;

FIG. 30 is a drawing showing deviations of resist pattern dimensions on a mask in the case of drawing with 1 shot of electron beam, for describing problems in the production of drawing data by the conventional variable shaping type apparatus;

FIG. 31 is a drawing showing deviations of resist pattern dimensions on a mask in the case of drawing with 2 shots of electron beams, for describing problems in the production of drawing data by the conventional variable shaping type apparatus;

FIG. 32 is a drawing showing a drawn graphic in the case of drawing with 1 shot of electron beam, for describing problems in the production of drawing data by the conventional variable shaping type apparatus;

FIG. 33 is a drawing showing the distribution of intensity of electron beam corresponding to FIG. 32;

FIG. 34 is a drawing showing a drawn graphic in the case of drawing with 2 shots of electron beams, for describing problems in the production of drawing data by the conventional variable shaping type apparatus;

FIG. 35 is a drawing showing the distribution of intensity of electron beams corresponding to FIG. 34;

FIG. 36 is a drawing showing deviations of resist pattern dimensions on a mask in the case of drawing with 2 shots of electron beams and the case of micro size electron beam, for describing problems in the production of drawing data by the conventional variable shaping type apparatus;

FIG. 37 is a drawing showing the data processing flow of electron beam drawing in the conventional electron beam drawing data producing apparatus;

FIG. 38 is a drawing for describing the processing for elimination of duplication among graphics;

FIG. 39 is a drawing for describing the processing for elimination of duplication among graphics;

FIG. 40 is a drawing for describing the processing for tone reversal among graphics; and FIG. 41 is a drawing for describing the processing for tone reversal among graphics.

DESCRIPTION OF THE PREFERRED EMBODIMENTS

Figure 1:
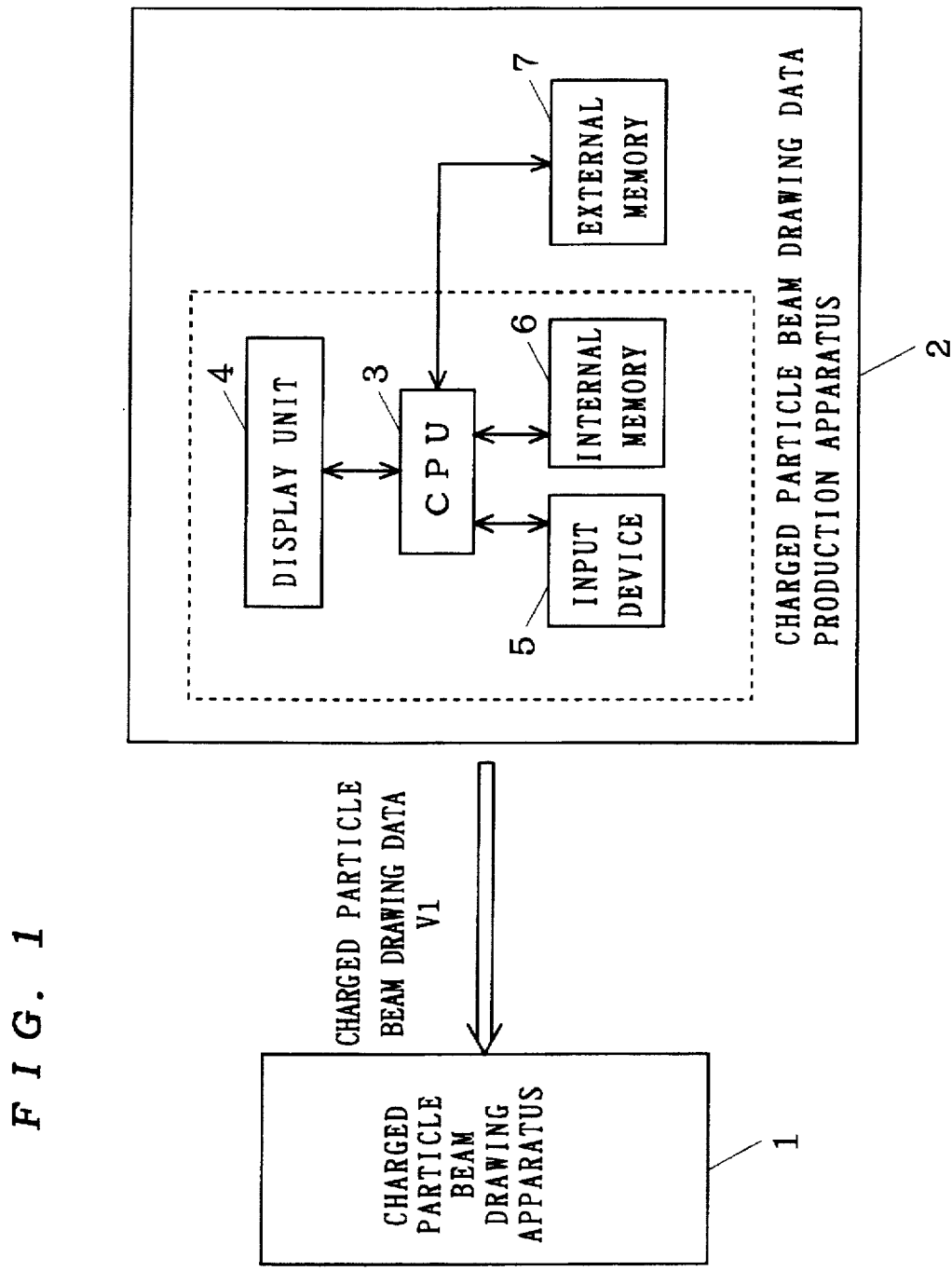
FIG. 1 is a block diagram showing the system construction of the charged particle beam drawing data production apparatus according to the respective embodiments of the present invention.

FIG. 1 is a block diagram showing the system construction of the charged particle beam drawing data production apparatus common to the respective first to fifth embodiments described hereafter.

In this drawing, a reference numeral 1 denotes a charged particle beam drawing apparatus a typical example of which is an electron beam drawing apparatus. The charged particle beam drawing apparatus performs drawing by receiving the input of a charged particle beam drawing data (signal) V1. The charged particle beam drawing data (signal) V1 will hereinafter be simply designated as a drawing data (signal) V1.

A charged particle beam drawing data production apparatus 2 is composed of a computer constructed centering around a CPU3 and an external memory 7 provided outside the computer. The computer is provided, in addition to the CPU3, with a display unit 4, an input device 5 such as a keyboard or a mouse, etc. and an internal memory 6 which consists of a ROM and a RAM.

The respective functions described in the respective embodiments hereafter are mainly functions of the CPU3.

14

The system consisting of the above-mentioned two apparatuses 1, 2 will be generally designated as a charged particle beam drawing system.

(First embodiment)

The first embodiment of the present invention will be described hereafter by referring to FIG. 1 as required.

Figure 2:
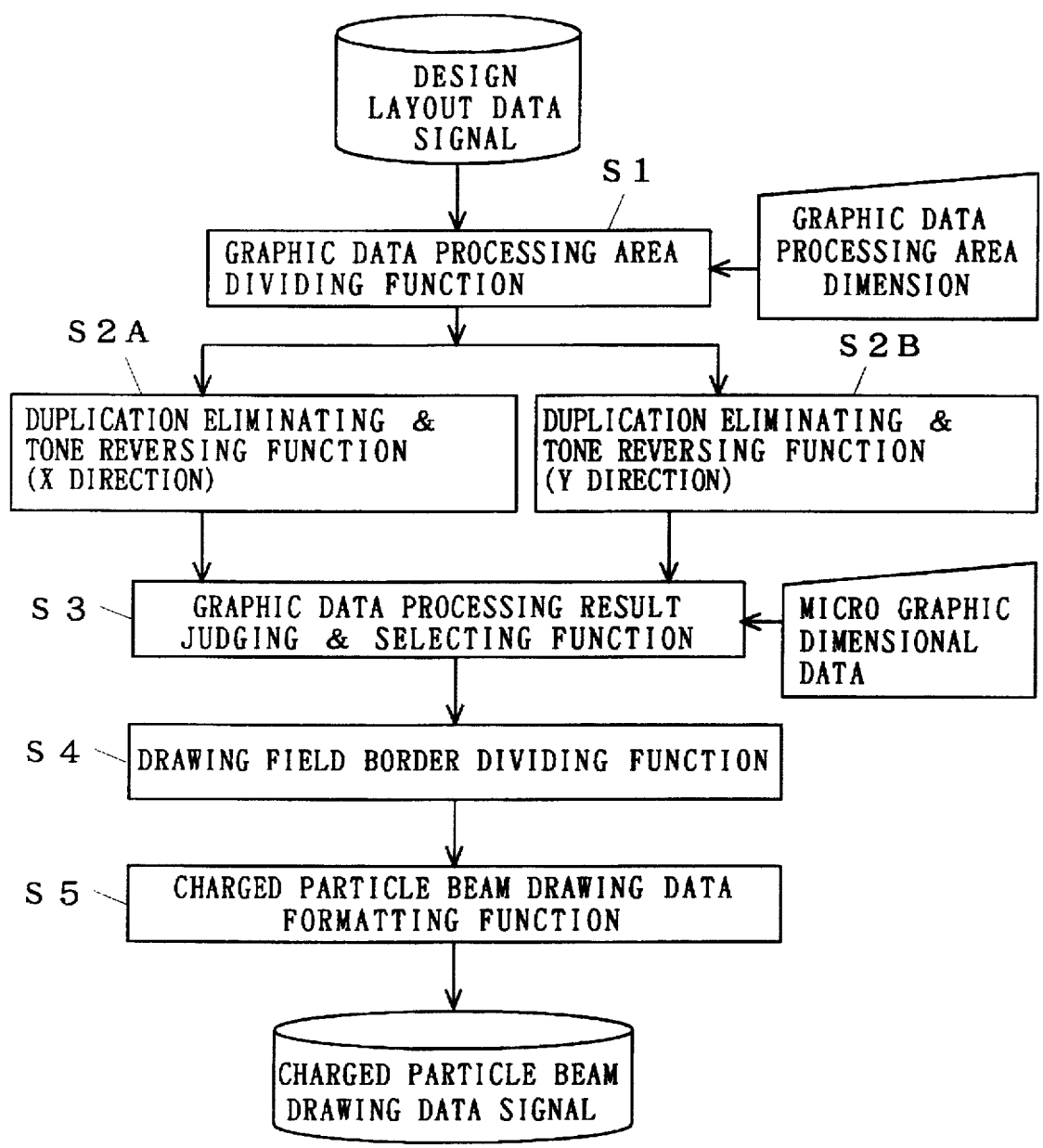
FIG. 2 is a drawing showing the flow of charged particle beam drawing data production of the charged particle beam drawing data production apparatus in the first embodiment of the present invention.

FIG. 2 shows the flow of data processing performed by the charged particle beam drawing data production apparatus 2 (mainly the CPU3) and is prepared for describing the first embodiment of the present invention. The first embodiment is characterized in that it is provided with ① a graphic data processing area dividing an function for dividing an input design layout data (signal) into units of graphic data processing area (a step S1), ② a graphic data processing result generating function for performing elimination of duplication and tone reversal process in the respective units of graphic data processing area for the respective stripes in both horizontal (X) direction and vertical (Y) direction (steps S2A, S2B), and ③ a graphic data processing result judging & selecting function for evaluating by comparison, judging and selecting the results of elimination of duplication and tone reversal processes performed with the stripes of the X, Y directions (corresponding to graphic data processing results) in the respective units of graphic data processing area (a step S3). Steps S4, S5 are the same as those in the conventional embodiment (see FIG. 37). The concrete processing flow will be described hereafter for the respective functions.

① The function of step SI will be described first. As stated in the description of the problems of prior art elimination of duplication and tone reversal processes are performed as a part of graphic operating processes generally by stripe method. However, since this method generates any dividing line for the respective vertexes of the respective graphics given by the design layout data, the situation of arrangement of the respective vertexes determines the quality (that is, generation of micro graphics) of graphic data which have been processed. FIG. 3 to FIG. 6 indicate concrete examples.

Figure 3:
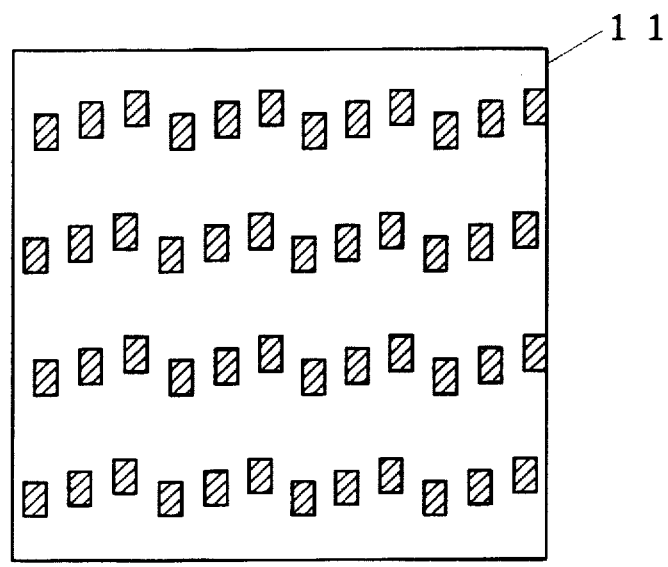
FIG. 3 is a drawing showing a concrete example for describing the first embodiment of the present invention.
Figure 4:
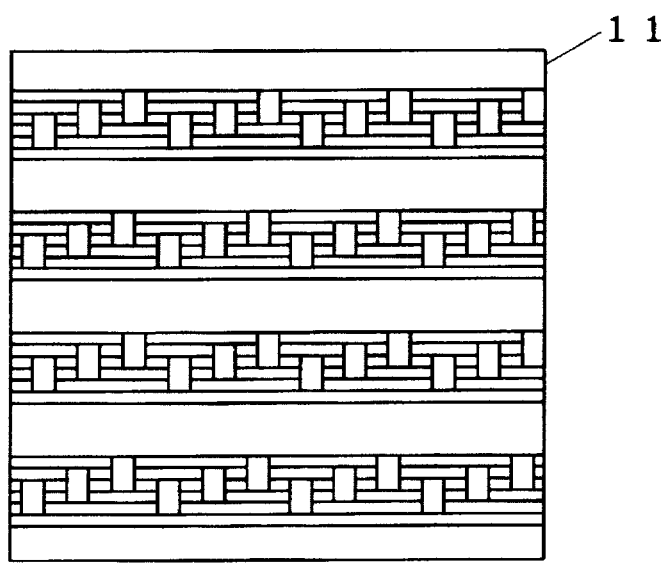
FIG. 4 is a drawing showing a concrete example for describing the first embodiment of the present invention.
Figure 5:
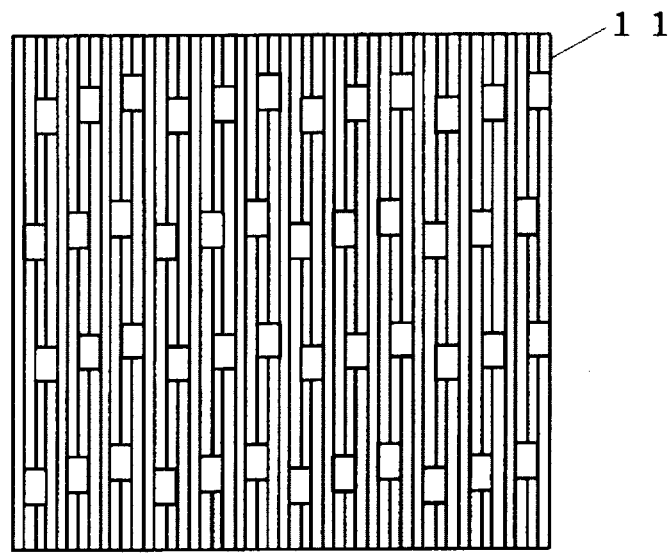
FIG. 5 is a drawing showing a concrete example for describing the first embodiment of the present invention.

First, as an example, consideration will be made of a case where the design layout data as shown in FIG. 3 is submitted to the elimination of duplication and tone reversal processes. In this case, the prior art selects either the stripes in the X direction (see FIG. 4) or the stripes in the Y direction (see FIG. 5). By such method, the situation of arrangement of the respective vertexes greatly affects the quality of graphic data after the processing as it is apparent from FIG. 4 and FIG. 5, and also brings about a situation in which the generation of micro graphics is unavoidable.

Figure 6:
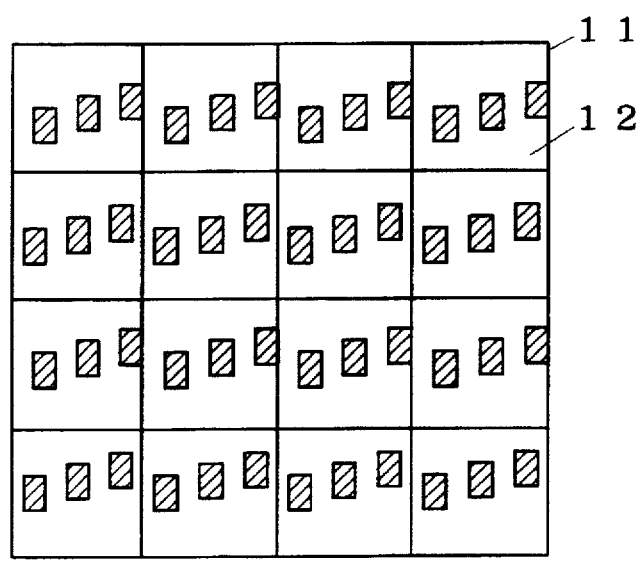
FIG. 6 is a drawing showing a concrete example for describing the first embodiment of the present invention.

So, to solve this problem, in this first embodiment, the CPU3 executes, in the step S1 of FIG. 2, the graphic data processing area dividing function on the basis of the design layout data (corresponding to a signal giving data of position coordinates) input by the input unit 5 and the data (signal) giving the dimensions of graphic data processing area. For example, the CPU3 divides the design layout data area 11, which is an area given with the design layout data (signal), into any graphic data processing areas 12 stipulated by the graphic data processing area dimensions, as shown in FIG. 6. And, the CPU3 performs, as described below, the elimination of duplication and tone reversal processes in the respective units of graphic data processing areas 12. By providing the CPU3 with this function of step S1, it becomes possible to suppress, at the processing time of elimination of duplication and tone reversal, the areas where the respective vertexes of the graphic influence the division of other graphic data and to thereby reduce the number of generation of micro graphics, leading to improvement of the quality of the drawing data.

② Next, the CPU3 performs the elimination of duplication and tone reversal processes in the stripes of the X direction (a step S2A) and the duplication and tone reversal processes in the stripes of the Y direction (a step S2B) in each graphic data processing area 12. At that time, the stripe method, which is the method described in the prior art, is used as processing method for both a step S2A and a step S2B.

First, dividing lines are inserted on the entire processing area in a fixed direction (corresponding to a horizontal direction or vertical direction) from the vertex of respective graphics to form the stripes. Next, the respective graphics are divided at stripe borders. FIG. 38 and FIG. 39 indicate a case of division in the horizontal direction.

Next, orientation is given (vectoring) to each side of the respective split graphics. The way of orientation is decided by either right turn or left turn of the respective vertexes along the sides. FIG. 38 and FIG. 39 represent a case of right turn (clockwise).

Next, unnecessary vectors (that is, duplicated portion of graphic) are deleted. The method of deletion is described hereafter.

First, each vector is sorted with coordinate values for each stripe. Next, a numerical value is given to each vector in correspondence to the direction of vector. For example, upward vectors are given as 1 and downward vectors as −1. This example is indicated in relation to stripe 5 of FIG. 38.

Next, in the case where stripes are formed horizontally, the numerical values given to respective vectors (corresponding to vectorial values) are added in order from the left in search of a vector where the total becomes 0. And, a graphic is constructed with the vector in which the addition was started and the vector where the result of addition of vectorial values becomes 0.

An example of such processing may be described as follows about the stripe 5 in FIG. 39: Namely, addition is started from the vector at the left end, and the result of addition of vectorial values becomes 2 in the stage of addition of the second vector, the result of addition of vectorial values becomes 1 in the stage of addition of the third vector, and the result of addition of vectorial values becomes 0 in the stage of addition of the fourth vector. Therefore, a graphic is constructed with the vector at the left end in stripe 5 and the fourth vector counting from there, and the second and the third vectors are deleted as unnecessary vectors. The result of processing becomes as indicated in FIG. 39.

By performing such processing to the vectors in all stripes, duplication of all graphics can be deleted.

The method of tone reversal of graphic is described hereafter by using FIG. 40 and FIG. 41.

The processing is started from the state in which the respective sides after elimination of duplication of graphics are divided in vectors. First, an area (frame) for tone reversal is set, and the graphic (that is, a rectangle) corresponding to this frame is split into vectors according to the respective stripes and a vector direction value is set for each vector in the same way as in the case of elimination of duplication.

Next, the direction of vector included in the tone reversal area is reversed. In its relation with FIG. 38 and FIG. 39, the vectors set upward are made to look downward and the vectors set downward are made to look upward at the time of elimination of duplication. This state is indicated in FIG. 40.

The processing after that is the same as the processing for elimination of duplication. The addition of vectorial values is started from the vector on the frame of tone reversal for each stripe to search for a pair of vectors where the added value becomes 0, thus forming a graphic. FIG. 41 indicated the tone reversed state.

Figure 7:
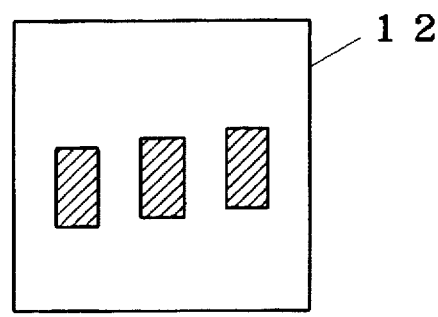
FIG. 7 is a drawing showing a concrete example for describing the first embodiment of the present invention.
Figure 8:
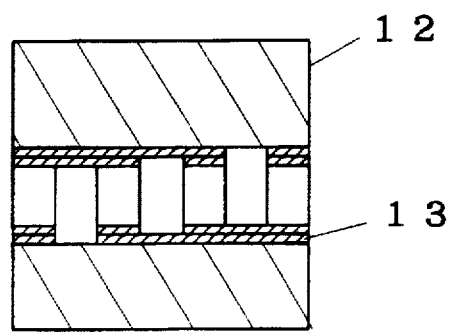
FIG. 8 is a drawing showing a concrete example for describing the first embodiment of the present invention.
Figure 9:
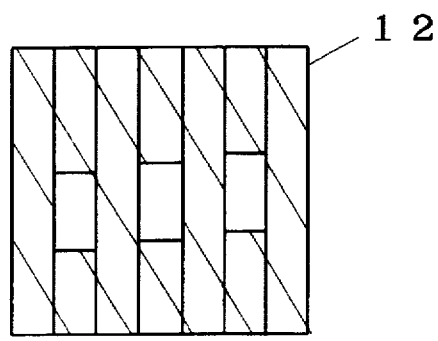
FIG. 9 is a drawing showing a concrete example for describing the first embodiment of the present invention.

FIG. 7 to FIG. 9 indicate examples of results of the above-described processing made in both the X direction and the Y direction for one graphic data processing area 12.

And, by computing the evaluation value for micro graphics, with the subsequent graphic data processing result judging & selecting function, against the results of elimination of duplication and tone reversal processes in respective directions (hereinafter also referred to as graphic data processing result giving position data signal of a basic graphic in the graphic data processing area 12) and performing comparison and selection, it becomes possible to reduce the quantity of production of micro graphics and produce the drawing data of higher quality.

Figure 10:
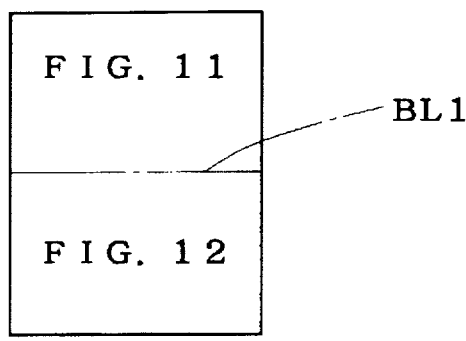
FIG. 10 is a flow chart for describing the graphic data processing result judging & selecting function in the first embodiment of the present invention.
Figure 11:
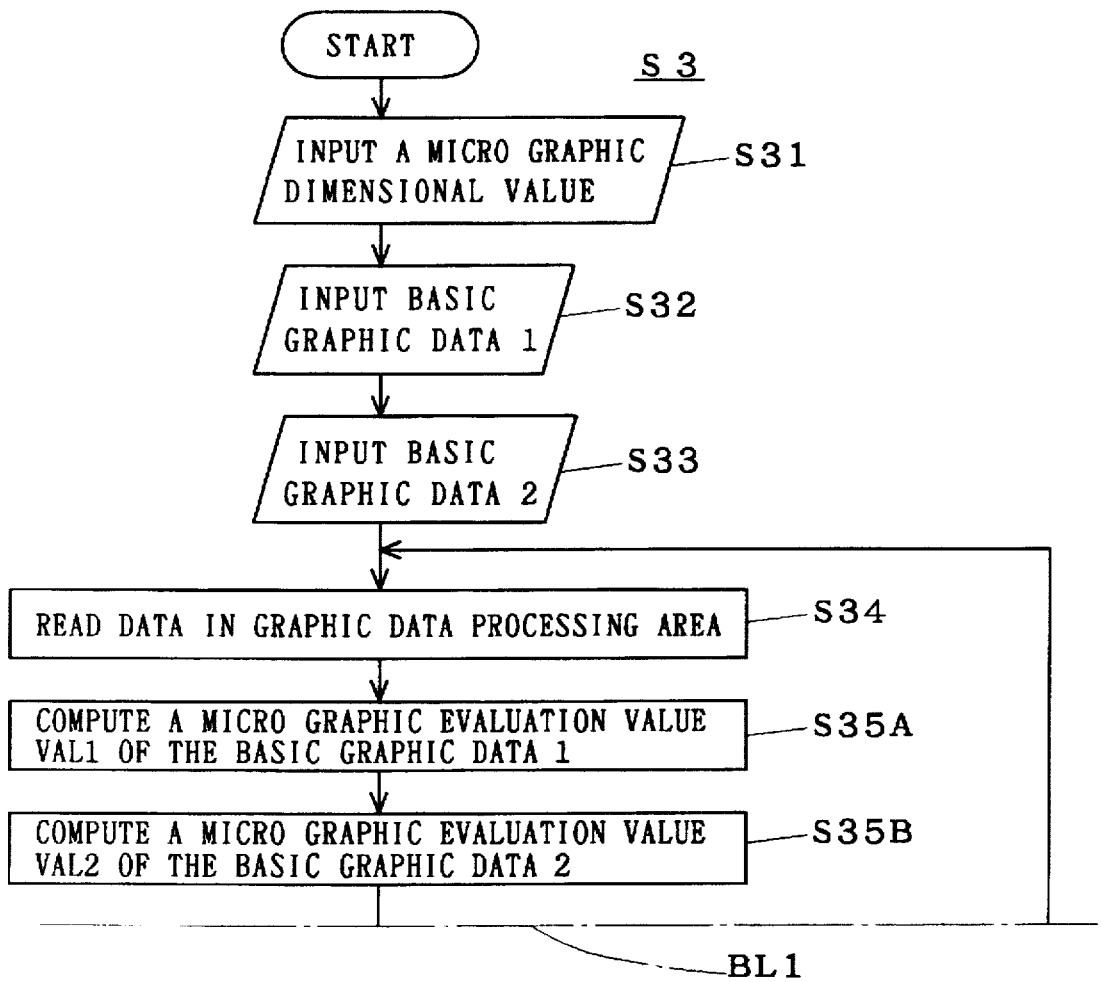
FIG. 11 is a flow chart for describing the graphic data processing result judging & selecting function in the first embodiment of the present invention.
Figure 12:
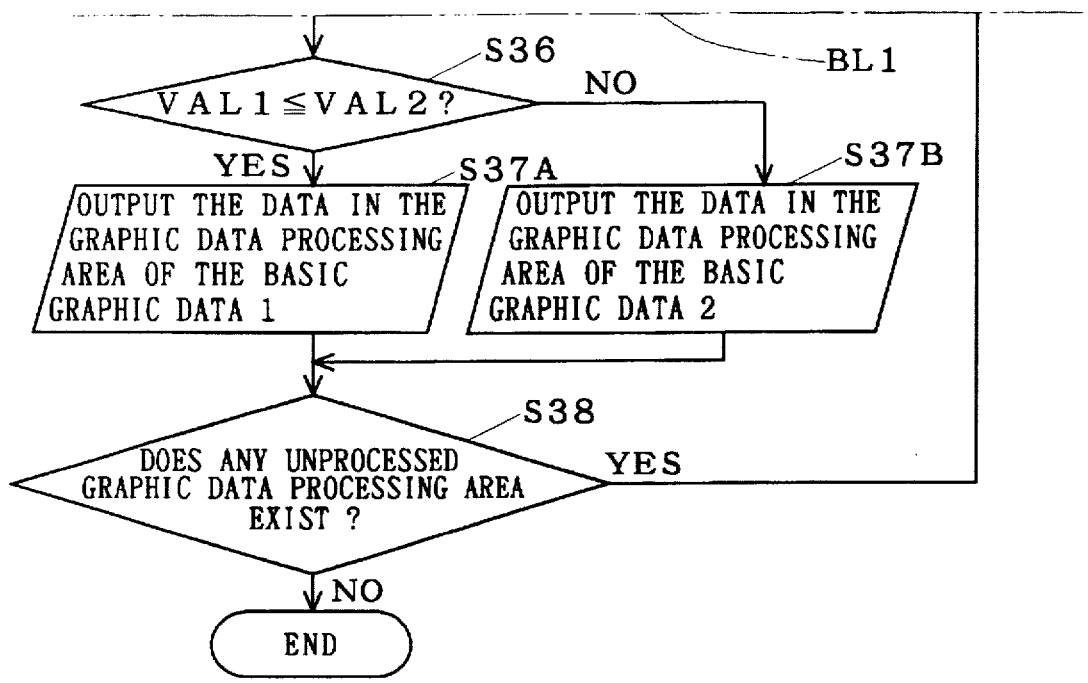
FIG. 12 is a flow chart for describing the graphic data processing result judging & selecting function in the first embodiment of the present invention.

③ And so, next, the graphic data processing result judging & selecting function of the step S3 will be described in detail. FIG. 10 to FIG. 12 are flow charts showing the processing procedure of the graphic data processing result judging & selecting function of FIG. 2. However, a chained line BL1 in FIG. 10 is a border line given for the sake of convenience for producing a complete flow chart through FIG. 11 and FIG. 12.

First, in step S31, the input unit 5 inputs a data (signal) giving a dimensional value of micro graphics and, by receiving it, the CPU3 stores the data giving that value in the internal memory 6. Although the dimensional value of micro graphics largely depends, as described earlier, on the type of drawing apparatus used or process conditions, etc., it is set for a value of 0.5 μm as general value in this example. Therefore, if the value of at least one side of the basic graphic is 0.5 μm or less, it is recognized as the micro graphic.

Next, the CPU3 stores the graphic data processing result for the X direction obtained in the step S2A, that is, the position coordinates data of the respective basic graphics, that is,(this data is designated as a basic graphic data 1) obtained by dividing the inside of the area 12 concerned on the X direction in unit of any graphic data processing area 12 and by submitting them to the tone reversal process, into the external memory 7 by setting the area 12 concerned as a filing unit (a step S32). In the same way, the CPU3 stores the graphic data processing result for the Y direction obtained in the step S2B into the external memory 7 as a basic graphic data 2 (a step S33).

Next, the CPU3 moves to the execution of the program which constitutes the core of the graphic data processing result judging & selecting function concerned. First, in a step S34, the CPU3 reads out the basic graphic data 1 and the basic graphic data 2 regarding one graphic data processing area 12 forming the subject of judgement of graphic data processing result, from the external memory 7, and stores them in the internal memory 6.

And, the CPU3 fetches the necessary data in the internal memory 6, and computes the micro graphic evaluation value for each of the basic graphic data 1 and the basic graphic data 2 by using the dimensional value of micro graphic as the criterion of evaluation (steps S35A, S35B). The micro graphic evaluation value as described here is given by expressing numerically the degree of influence which the micro graphics have on the drawing with a certain index. And the larger this value the larger the degree of influence of the micro graphics on the drawing. The method of computation of micro graphic evaluation value will be described later.

Next, the CPU3 compares the micro graphic evaluation values VAL1, VAL2 obtained in steps S35A, S35B respectively (a step S36), and selects the graphic data processing result with the smaller micro graphic evaluation value to output it into the internal memory 6 (steps S37A, S37B). And, the CPU3 performs those operations (S34 to S37A, S37B) until there is no more unprocessed graphic data processing area 12 (a step S38).

Figure 13:
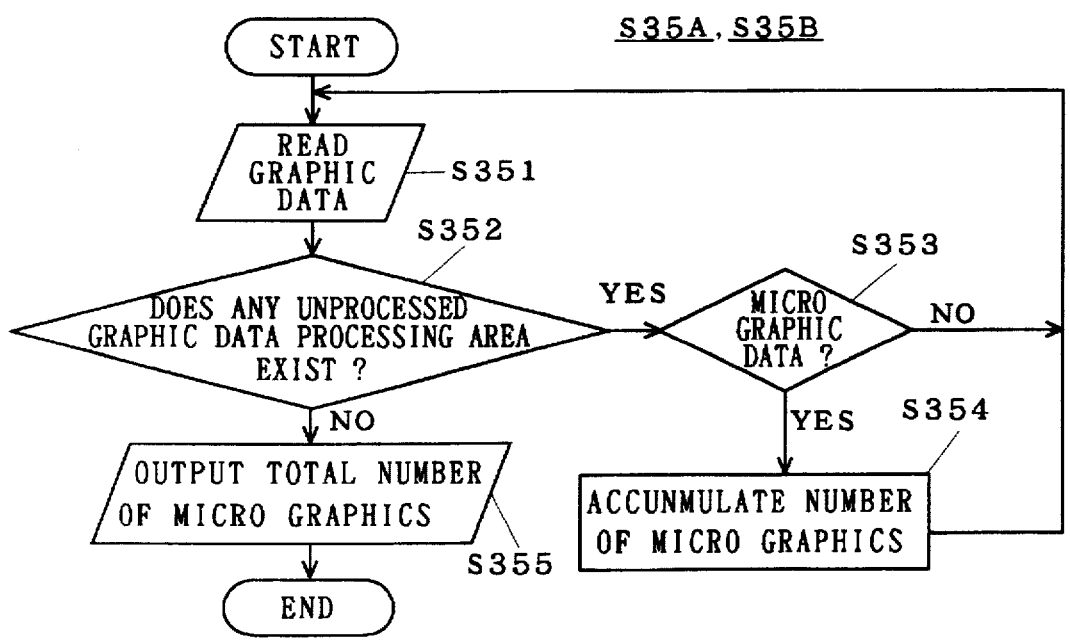
FIG. 13 is a flow chart for describing the method of computation of micro graphic evaluation value in the graphic data processing result judging & selecting function in the first embodiment of the present invention.

Next, the method of computation of micro graphic evaluation values VAL1, VAL2 described before is described by using the flow chart shown in FIG. 13. Namely, the CPU3 judges, for each of the basic graphics input, if either of the dimension of width or the dimension of height has a dimension no larger than the given dimensional value of micro graphic or not (a step S351 to a step S353). And, when it is judged as having such dimension, the CPU3 recognizes that basic graphic as the micro graphic, totalizes the number of micro graphics against all basic graphics inside the graphic data processing area concerned (a step S354) and outputs the total number of micro graphics obtained as the micro graphic evaluation values (VAL1, VAL2) (a step S355).

A concrete example of this processing will be described by using an example of FIG. 7 to FIG. 9. Supposing that one of the graphic data processing areas 12 divided in FIG. 6 is one shown in FIG. 7, the description will be given hereafter with special attention to this graphic data processing area 12. When this data is submitted to elimination of duplication and tone reversal processes with the stripes in the X, Y directions the results become as shown in FIG. 8 and FIG. 9, respectively. Next, the dimensional value of micro graphic is computed by the graphic data processing result judging & selecting function first, and 10 micro graphics 13 exist in the case of FIG. 8 while no micro graphic exists in the case of FIG. 9. As a result, the micro graphic evaluation values VAL1, VAL2 become 10 and 0 respectively and, as output data, the data of FIG. 9 (corresponding to the basic graphic data 2) regarding the stripe in the Y direction is selected.

The drawing field border dividing function in step T4 is executed. This function is a function of dividing the drawing area into areas where the electron beam drawing system can draw with deflection of electron beam only (hereinafter referred to as "drawing field areas"). After that, the electron beam drawing data formatting function for formatting the data into a structure available for inputting in various drawing systems of step T5 is executed, to thereby generate the electron beam drawing data. The variable shaping type electron beam drawing system taken up here as example can set the size of the drawing field area at an optional value of usually 2.5 mm or under.

As described above, in this first embodiment, it is possible to not only suppress the area in which the respective vertexes of the graphic have influence, at the processing time of the elimination of duplication and tone reversal, on the division of other graphic data but also to realize sharp reduction in the generation of micro graphics because of the function of performing elimination of duplication and tone reversal with the stripes in the X, Y directions, respectively, and comparing, judging and selecting the results of such operations, thus enabling production of high-quality drawing data.

(Example of first application of first embodiment)

Figure 14:
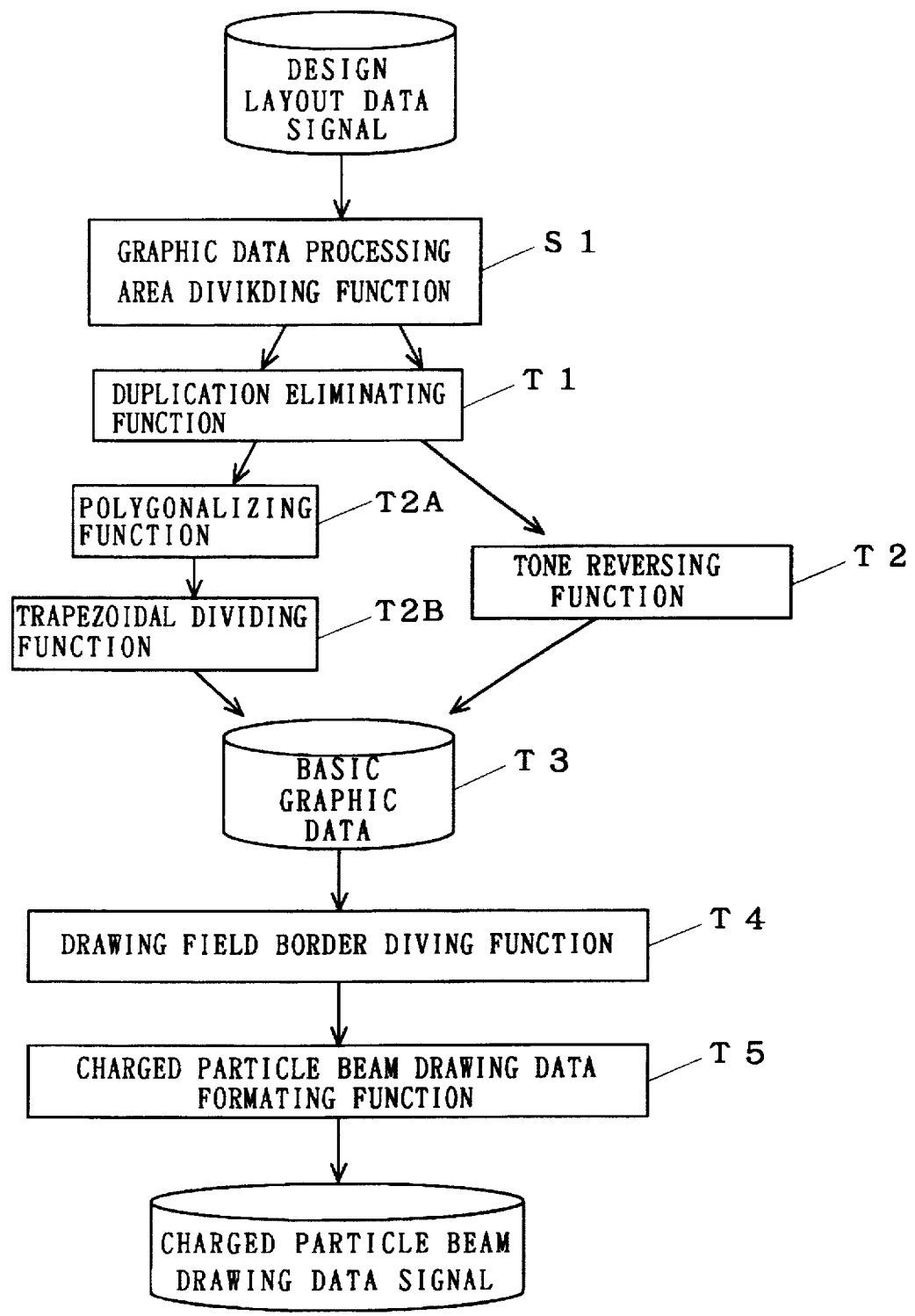
FIG. 14 is a flow chart indicating a modified example of the first embodiment.

As an example of first application of the first embodiment, the graphic data processing area dividing function described in the step S1 of FIG. 2 can also be attached as independent function separately from the charged particle beam drawing data production apparatus (2 in FIG. 2), in the processing procedure of the conventional drawing data production apparatus as indicated in FIG. 37, for example. Such application example is indicated in the drawing data production flow of FIG. 14. In this drawing, steps T1 to T5, T2A and T2B are the same steps as those of the conventional embodiment.

By so doing, the generation of micro graphics produced at the time of elimination of duplication can be reduced and, as a result, the generation of micro graphics resulting from the tone reversal is suppressively controlled even if that step T2 is executed when the tone reversal is necessary, thus making it possible to reduce deterioration of dimensional accuracy of resist patterns. Moreover, another advantage is that the processing of steps T2A, T2B performed when no tone reversal is required can also be performed easily because the quantity of generation of micro graphics produced in the step T1 is reduced in advance with prior execution of the step S1.

(Example of second application of first embodiment)

This first embodiment is effective particularly in the case where the tone reversal process is required and the description has been given by talking such case as example. However, even in the case where no tone reversal process is required, it is possible to reduce the generation of micro graphics by performing the processing after the elimination of duplication by means of the graphic data processing result judging & selecting function of the step S3 in FIG. 2. Namely, this example of second application corresponds to one in which the portion of steps T2A, T2B in FIG. 37 is replaced with the step S3 of FIG. 2. An example of concrete processing procedure of this example of second application is indicated in FIG. 15.

Figure 15:
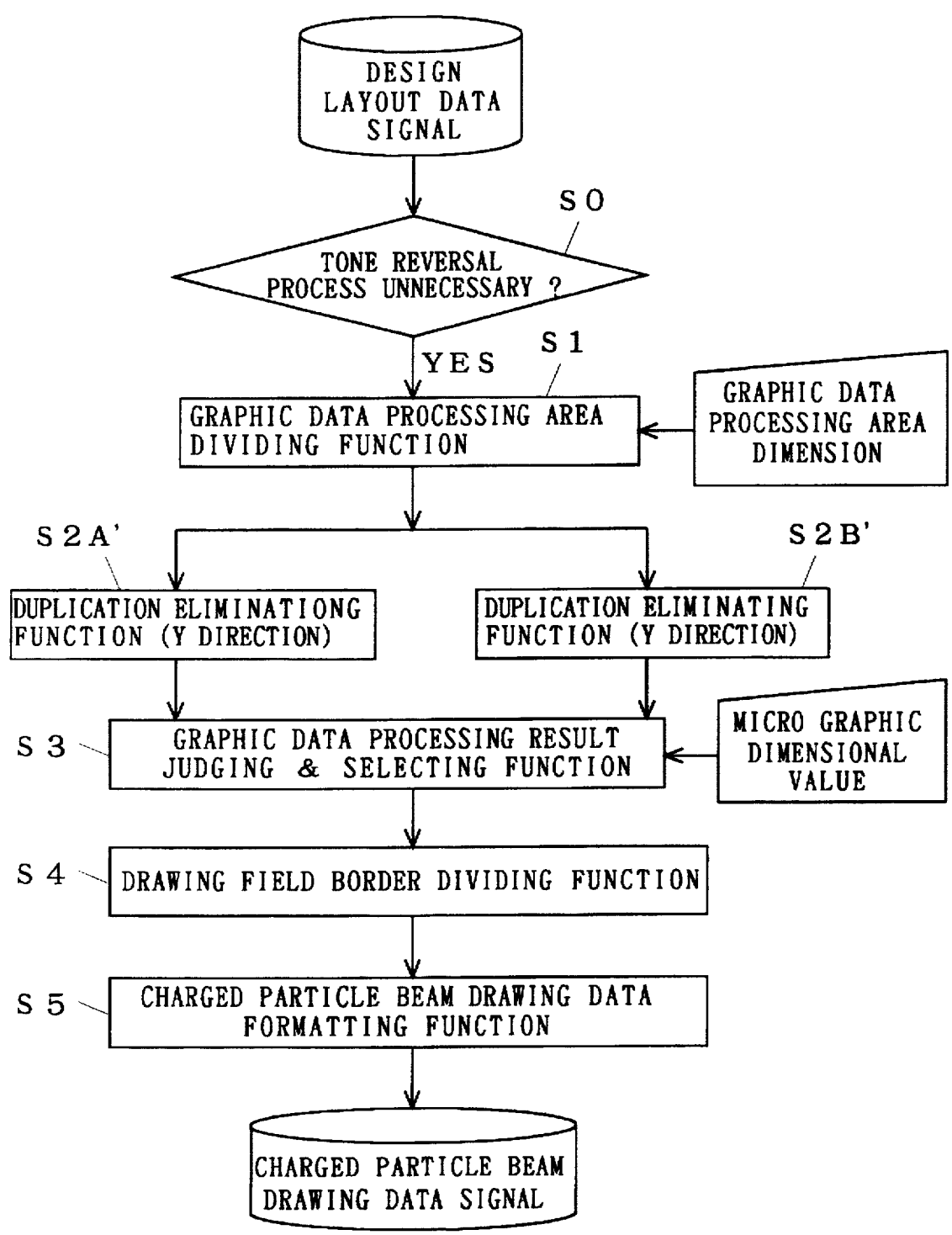
FIG. 15 is a flow chart indicating a modified example of the first embodiment.

The processing of FIG. 15 has the following advantage compared with the steps T2A, T2B of FIG. 37: Namely, this example of second application has the merit of further shortening the processing time because it can simplify the processing procedure and can develop operations by maintaining the conventionally employed method as it is.

(Example of third application of first embodiment)

Moreover, the technical idea of the first embodiment provides the same effects as in the first embodiment by applying the graphic data processing area dividing function and the graphic data processing result judging & selecting function not only for the tone reversal and the elimination of duplication described above but also for various kinds of graphic operating process using the stripe method such as an outputting process of duplicated parts only (corresponding to an AND processing), for example.

(Second embodiment)

Figure 16:
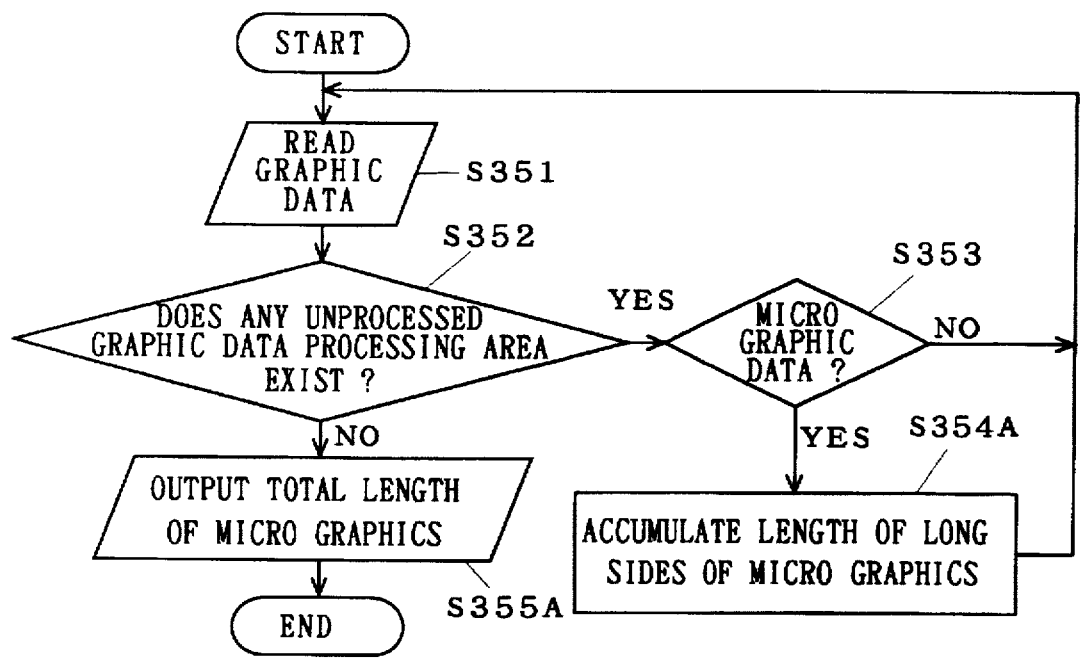
FIG. 16 is a flow chart for describing the method of computation of micro graphic evaluation value in the second embodiment of the present invention.

While the micro graphic evaluation value is given as the total number of micro graphics in the graphic data processing result judging & selecting function described in the first embodiment, the micro graphic evaluation value is calculated as sum of the length of long sides of micro graphics as shown in the flow chart of FIG. 16 (see steps S354A, S355A), in this second embodiment instead. Other points are the same as in the first embodiment.

Figure 17:
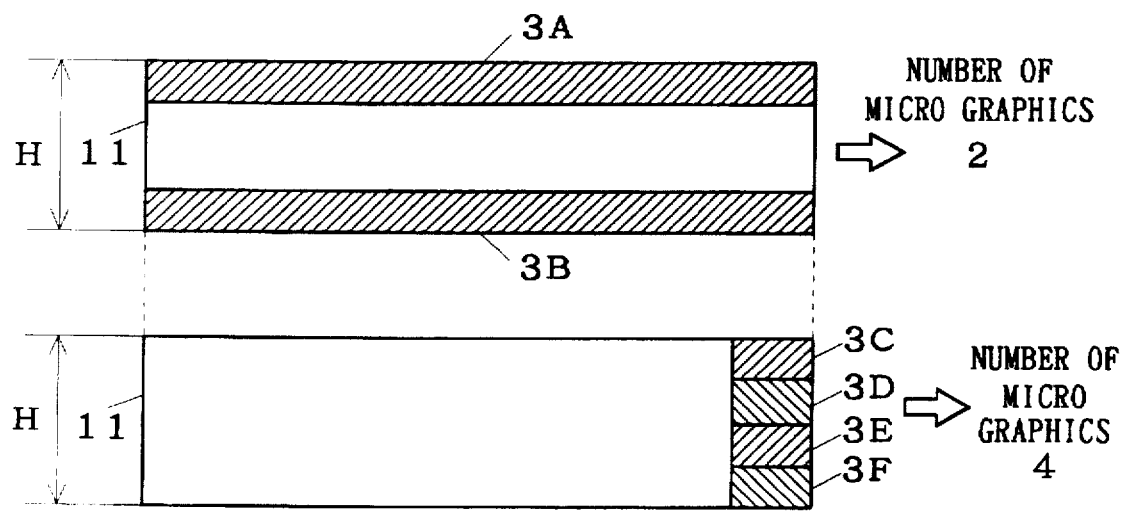
FIG. 17 is a drawing for describing the effects of the second embodiment.

By so doing, it becomes possible to perform micro graphic evaluation of high accuracy and, as a result, obtain drawing data of higher quality compared with the first embodiment. The reason for is as schematically described in FIG. 17. Namely, of the 2 graphic data in FIG. 17, the data illustrated on the upper side has 2 micro graphics 3A, 3B and its number of micro graphics is smaller than that of the graphic data illustrated on the lower side having 4 micro graphics 3C, 3D, 3E, 3F. However, the respective long sides of the micro graphics 3A, 3B in the former are longer than the respective long sides of the micro graphics 3C to 3F. This means that expansion of areas in which micro graphics exist further accelerates deterioration of dimensional accuracy. Therefore, it means that it is better to determine the micro graphic evaluation value by using the sum of long sides of micro graphics rather than the sum of the numbers of micro graphics to select and output more appropriate graphic data. According to this method, the latter graphic data is selected in the case of FIG. 17 and this provides more favorable results.

(Third embodiment)

Figure 18:
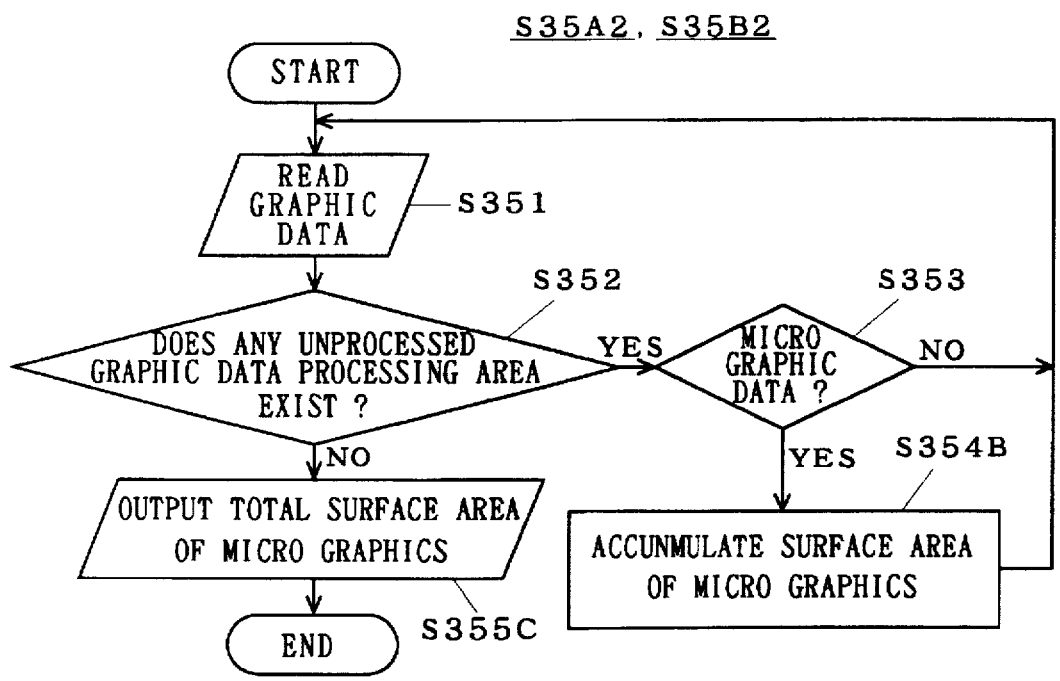
FIG. 18 is a flow chart for describing the method of computation of micro graphic evaluation value in the third embodiment of the present invention.

While, in the second embodiment, the micro graphic evaluation value was computed with the sum of length of long side of each micro graphic in the graphic data processing result judging & selecting function, the micro graphic evaluation value is calculated as sum of the surface areas of respective micro graphics in this third embodiment, as shown in the flow chart of FIG. 18 (see steps S354B, S355B). This provides the same effects as in the second embodiment.

(Fourth embodiment)

Figure 19:
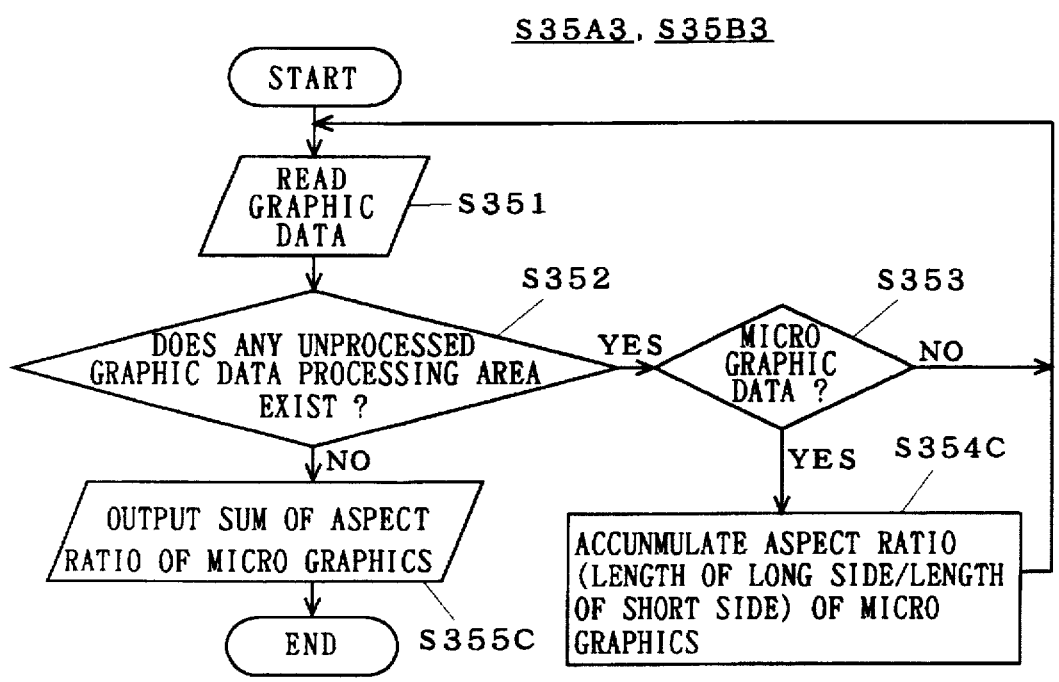
FIG. 19 is a flow chart for describing the method of computation of micro graphic evaluation value in the fourth embodiment of the present invention.

While, in the third embodiment, the micro graphic evaluation value was computed with the sum of surface areas of respective micro graphics in the graphic data processing result judging & selecting function, the micro graphic evaluation value is calculated as sum of the aspect ratios (corresponding to (length of long side)/(length of short side)) of respective micro graphics in this fourth embodiment, as shown in the flow chart of FIG. 19 (see steps S354C, S355C). This provides the same effects equivalent or superior to those of the second and third embodiments.

Figure 20:
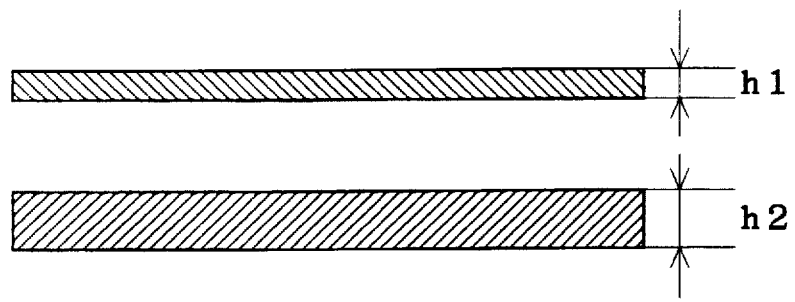
FIG. 20 is a drawing for describing the effects of the fourth embodiment.

Here, FIG. 20 schematically indicates the point at which the fourth embodiment is superior to the second and the third embodiments and, in this drawing, a symbol "d" denotes a micro graphic dimensional value. According to the second embodiment, the two graphic data of height h1, height h2 are evaluated as equal. Moreover, according to the third embodiment, the micro graphic of height h1 is smaller in surface area and this leads to selection of this graphic data, but it is not proper to select this graphic data of height h1 because the deterioration of dimensional accuracy of the resist pattern formed gets larger as a narrower area is the graphic data of height h2 should be selected. At this point, the fourth embodiment can be considered to be superior to the second and the third embodiments, because the graphic data of height h2 is selected according to the fourth embodiment.

(Addition)

It is also all right to compute the micro graphic evaluation value by using at least 2 combinations of the first to the fourth embodiments.

(Fifth embodiment)

While, in the first to the fourth embodiments, the basic graphics having a dimension no larger than the micro graphic dimensional value given as fixed value are judged as the micro graphics in the graphic data processing result judging & selecting function, the dimensional control of actual drawing patterns becomes more difficult, from the viewpoint of difficulty of control of the shape of electronic beam, with the basic graphics having a dimension no larger than the micro graphic dimensional value and with the basic graphics the dimension of which is smaller.

Figure 21:
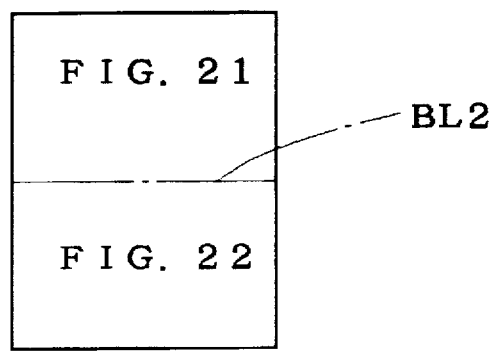
FIG. 21 is a flow chart for describing the graphic data processing result judging & selecting function in the fifth embodiment of the present invention.
Figure 22:
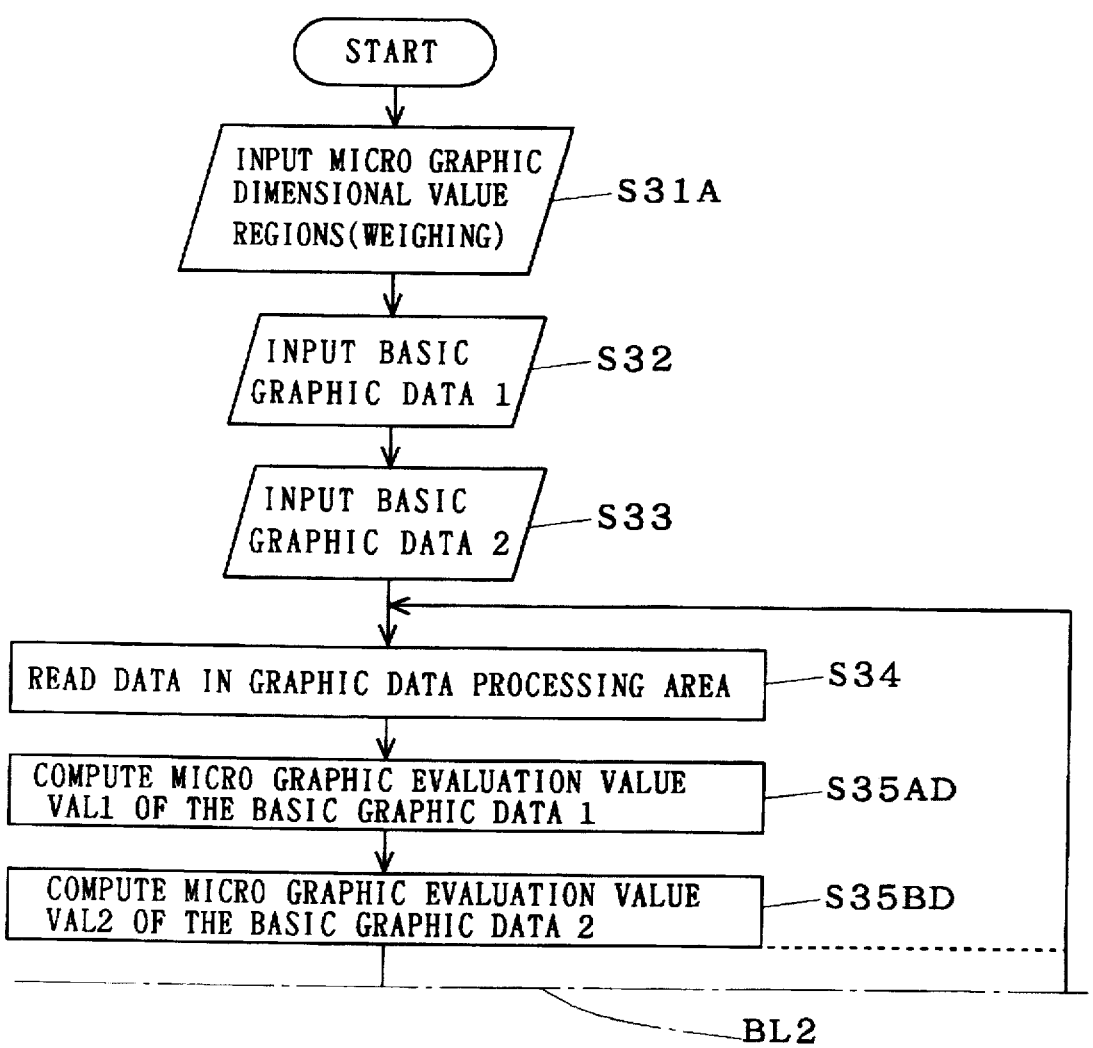
FIG. 22 is a flow chart for describing the graphic data processing result judging & selecting function in the fifth embodiment of the present invention.
Figure 23:
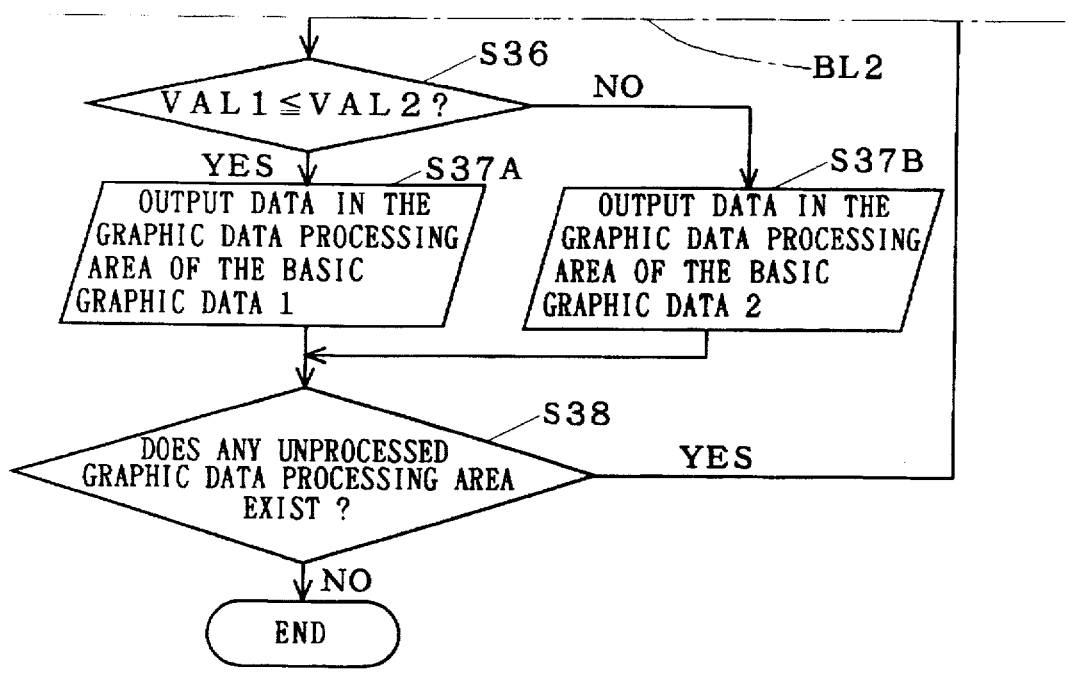
FIG. 23 is a flow chart for describing the graphic data processing result judging & selecting function in the fifth embodiment of the present invention.

So, in this fifth embodiment, the micro graphic dimensional value is specified with a plural number of dimensional areas and weighing indicating the degree of important of micro graphic dimensional value is set for the respective areas, as indicated in the flow charts of FIG. 21 to FIG. 23 (see a step S31A). This makes it possible to perform micro graphic evaluation of higher accuracy compared with the first to the fourth embodiments and, as a results obtain drawing data of higher quality.

The steps S35AD, S3SBD may be any of the methods described in the first to the fourth embodiments or any combination thereof. For example, the computation of the micro graphic evaluation value (VAL1, VAL2) is made by multiplying the number of pieces, i.e. 1 with the weighing to accumulate when the method of the first embodiment is used (see FIG. 24), and it is made by multiplying the length, surface area and aspect ratio with the weighing respectively, to accumulate when the each method of the second to the fourth embodiments is used.

Figure 24:
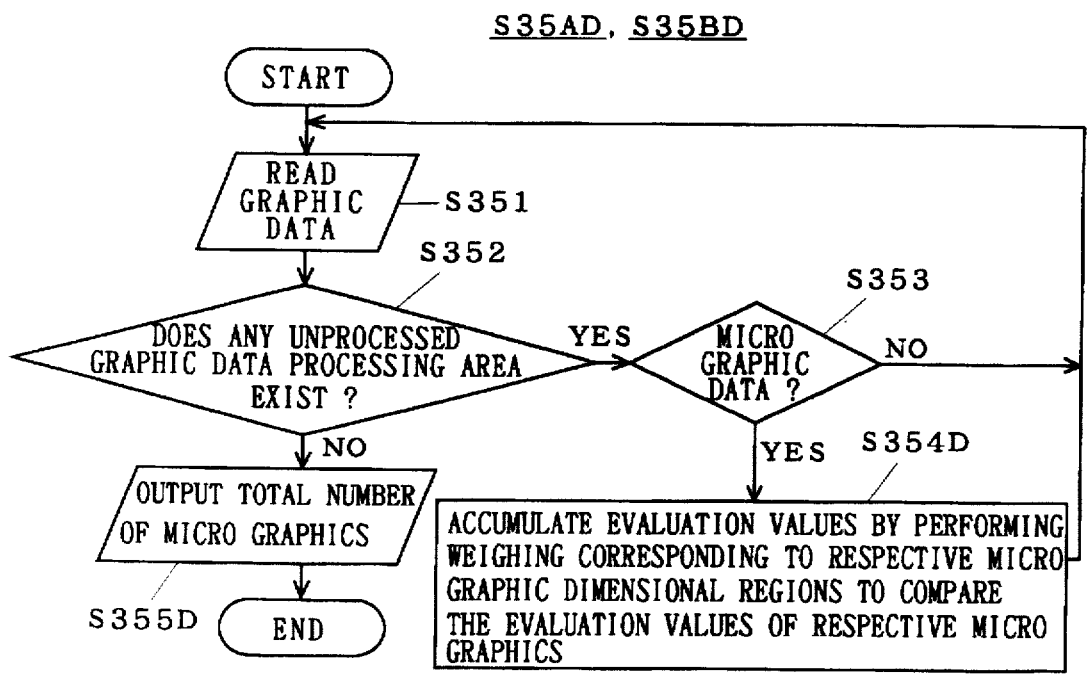
FIG. 24 is a flow chart for describing the method of computation of micro graphic evaluation value in the fifth embodiment of the present invention.
Figure 28:
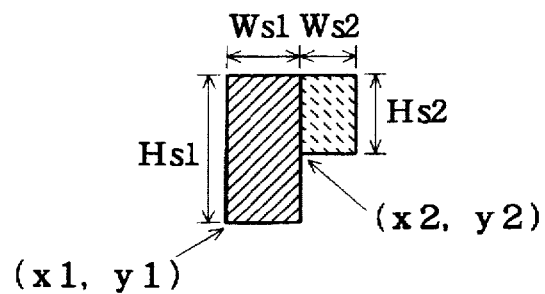
FIG. 28 is a drawing showing the electron beam drawing data for describing the conventional variable shaping type drawing procedure.

FIG. 24 indicates an example of the method of specification of the area of the micro graphic dimensional value and the method of specification of weighing. Here, 5 areas of 0.1 μm or under, larger than 0.1 μm but no more than 0.2 μm, larger than 0.2 μm but no more than 0.3 μm, larger than 0.3 μm but no more than 0.4 μm, and larger than 0.4 μm but no more than 0.5 μm are given as the micro graphic dimensional value areas. In this drawing, a symbol L indicates the length of side of the basic graphic recognized as the micro graphic and, if the side length L of the basic graphic is found in the area of the micro graphic dimensional value specified in the range of 0.2 μm to 0.3 μm, for example, the weighing becomes 3.

(Summary)

As described above, according to the respective embodiments of this invention, it becomes possible to suppressively control, at the time of conventional elimination of duplication and tone reversal, the areas in which the respective vertexes of the graphic influence on the division of other graphic data by having the graphic data processing area dividing function and, in addition, to provide effects of realizing sharp reduction of generation of micro graphics to thus produce drawing data of high quality because the respective embodiments are designed to have the graphic data processing result judging & selecting function for performing the elimination of duplication and tone reversal with the stripes of the X, Y directions, respectively, and for comparing, judging and selecting the results thereof.

While the invention has been shown and described in detail, the foregoing description is in all aspects illustrative and not restrictive. It is therefore understood that numerous modifications and variations can be devised without departing from the scope of the invention.

We claim:

1. A charged particle beam drawing data production apparatus comprising:

a design layout data source providing a design layout data signal indicating the dimensions of an area of a design layout and design layout element data for input to the charged particle beam drawing data production apparatus;

an input unit supplying a signal specifying dimensions defining a graphic data processing area; and a graphic data processing area determining portion receiving the design layout data signal indicating the dimensions of the area of the design layout from the design layout data source and the signal specifying the dimensions of the graphic data processing area from the input unit and dividing the area of the design layout indicated by said design layout data signal into a plurality of graphic data processing areas.

2. The charged particle beam drawing data production apparatus of claim 1, wherein said input unit further supplies a micro graphic dimensional reference value to said charged particle beam drawing data production apparatus which further comprises:

- a graphic data processing result generating portion executing a prescribed graphic processing operation relative to each of the plurality of graphic data processing areas in both a horizontal direction and a vertical direction responsive to said design layout data signal from said design layout data source to generate a graphic data processing area result including data signals defining basic graphics relative to each of the plurality of the graphic data processing areas; and
- a graphic data processing result judging and selecting portion receiving said micro graphic dimensional reference value from said input unit and said data signals defining basic graphics for each of the plurality of areas from the graphic data result generating portion to determine a micro graphic evaluation value indicating a degree of undesirable influence of micro graphics on charged particle beam drawing in both the horizontal direction and the vertical direction, and comparing said micro graphic evaluation value determined relative to both said horizontal direction and said vertical direction and selecting said graphic data processing area result with respect to the direction in which said micro graphic evaluation value is smaller.

3. The charged particle beam drawing data production apparatus of claim 2, wherein said graphic data processing result generating portion further comprises:

- a duplication eliminating section executing removal of duplicated parts in said design layout data signal as said prescribed graphic processing operation.

4. The charged particle beam drawing data production apparatus of claim 2, wherein said graphic data processing result generating portion further comprises:

- a duplication eliminating and tone reversing section detecting, and removing duplicated parts of the design layout data signal and executing a tone reversal process relative to said design layout data signal as said prescribed graphic processing operation.

5. The charged particle beam drawing data production apparatus of claim 4, wherein said input unit provides a signal specifying a weight factor defining a degree of importance of each micro graphic dimensional value over a plural number of micro graphic dimensional regions, and said graphic data processing result judging and selecting portion further comprises:

- a micro graphic determining segment determining whether or not at least one of a dimensional value of a side of said basic graphic falls in any of a plural number of said micro graphic dimensional regions; and
- a micro graphic evaluation value computing segment for computing said micro graphic evaluation value on the basis of said signal specifying said weight factor provided in corresponding said micro graphic dimensional regions in each of said horizontal direction and said vertical direction.

6. The charged particle beam drawing data production apparatus of claim 4, wherein said graphic data processing result judging and selecting portion further comprises:

- a micro graphic determining segment determining that the data signals defining basic graphics relative to each of the plurality of the graphic data processing areas include said micro graphic dimensional value as a value of at least one side of a basic graphic no larger than said micro graphic dimensional reference value received from said input unit in each of said horizontal direction and said vertical direction.

7. The charged particle beam drawing data production apparatus of claim 6, wherein said graphic data processing result judging and selecting portion further comprises:

- a micro graphic evaluation value computing and accumulating segment determining a dimensional value associated with said micro graphics as said micro graphic evaluation value in each of said horizontal direction and said vertical direction.

8. The charged particle beam drawing data production apparatus of claim 6, wherein said graphic data processing result judging and selecting portion further comprises:

- a micro graphic evaluation value determining segment determining a length of a long side of said micro graphics and an accumulation segment receiving and accumulating said lengths to output a sum of said lengths as said micro graphic evaluation value in each of said horizontal direction and said vertical direction.

9. The charged particle beam drawing data production apparatus of claim 6, wherein said graphic data processing result judging and selecting portion further comprises:

- a micro graphic evaluation value computing segment computing surface area of said micro graphics and an accumulating segment receiving and accumulating data indicating a sum of said surface areas and outputting the accumulated sum of said surface areas of said micro graphics as said micro graphic evaluation value in each of said horizontal direction and said vertical direction.

10. The charged particle beam drawing data production apparatus of claim 6, wherein said graphic data processing result judging and selecting portion further comprises:

- a micro graphic evaluation value computing segment computing aspect ratios of a length of a long side to a length of a short side of said micro graphics and an accumulating segment receiving and accumulating data indicating a sum of said aspect ratios and outputting the accumulated sum of said aspect ratios of said micro graphics as said micro graphic evaluation value in each of said horizontal direction and said vertical direction.

11. A charged particle beam drawing data production apparatus for producing a drawing data signal to be input to a charged particle beam drawing apparatus from a design layout data signal received from a layout source, comprising:

- input means for inputting a signal giving a micro graphics dimensional value;
- graphic data processing result generating means for executing prescribed graphic processing operations relative to said design layout data signal received from said layout source to generate a graphic data processing result including data signals of basic graphics formed in an area defined by said design layout data signal in each of a horizontal direction and a vertical direction of said area; and
- graphic data processing result judging and selecting means for judging data signals of said basic graphics included in said graphic data processing result based on a comparison with said signal of said micro graphic dimensional value from said input means to determine a micro graphic evaluation value indicating a degree of influence of said micro graphics on charged particle beam drawing in each of said horizontal direction and said vertical direction, and for further comparing each said micrographic evaluation value regarding said horizontal direction and said vertical direction to select said graphic data processing result relative to the direction in which said micro graphic evaluation value is determined to be smaller.

12. A charged particle beam drawing system, comprising:

a charged particle beam drawing data production apparatus for producing a drawing data signal from a design layout data signal provided by a layout source; and a charged particle beam drawing apparatus for performing charged particle beam drawing on the basis of said drawing data signal from said charged particle beam drawing data production apparatus to form a resist pattern, said charged particle beam drawing data production apparatus further comprising:

input means for inputting a signal specifying graphic data processing area dimensions and a signal specifying a micro graphic dimensional value;

graphic data processing area dividing means for dividing an area given by said design layout data signal provided by said layout source into graphic data processing areas determined by said graphic data processing area dimensions;

graphic data processing result generating means for executing prescribed graphic processing operations relative to said design layout data signal from said layout source in both a horizontal direction and a vertical direction of an area defined by said design layout data signal, to generate a graphic data processing result having data signals of basic graphics formed in each of the graphic data processing areas;

graphic data processing result judging and selecting means for determining a data signal indicating micro graphics among said data signals of said basic graphics included in said graphic data processing result on the basis of said signal specifying said micro graphic dimensional value from said input means to define a micro graphic evaluation value indicating a degree of influence of said micro graphics on said charged particle beam drawing in each of said horizontal direction and said vertical direction, and for comparing said micro graphic evaluation value regarding said horizontal direction and said vertical direction to select and output said graphic data processing result along the direction in which said micro graphic evaluation value is smaller relative to each graphic data processing area; and drawing data processing means for producing said drawing data signal on the basis of said drawing data processing result output by said graphic data processing result judging and selecting means.

* * * * *